US009627735B2

(12) United States Patent
Wakabayashi et al.

(10) Patent No.: US 9,627,735 B2
(45) Date of Patent: Apr. 18, 2017

(54) HIGH-FREQUENCY SIGNAL LINE AND ELECTRONIC DEVICE PROVIDED WITH THE SAME

(71) Applicant: Murata Manufacturing Co., Ltd., Nagaokakyo-shi, Kyoto-fu (JP)

(72) Inventors: Yuki Wakabayashi, Nagaokakyo (JP); Bunta Okamoto, Nagaokakyo (JP); Satoshi Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/159,967

(22) Filed: May 20, 2016

(65) Prior Publication Data

US 2016/0268666 A1    Sep. 15, 2016

Related U.S. Application Data

(63) Continuation of application No. PCT/JP2015/063331, filed on May 8, 2015.

(30) Foreign Application Priority Data

May 29, 2014   (JP) ................................. 2014-110846

(51) Int. Cl.
*H01P 3/08*    (2006.01)
*H05K 1/02*    (2006.01)
(Continued)

(52) U.S. Cl.
CPC .............. *H01P 3/08* (2013.01); *H01P 1/2039* (2013.01); *H01P 3/082* (2013.01); *H05K 1/0237* (2013.01);
(Continued)

(58) Field of Classification Search
CPC .. H01P 3/08; H01P 3/081; H01P 3/082; H01P 3/085
(Continued)

(56) References Cited

U.S. PATENT DOCUMENTS

2014/0003007 A1    1/2014   Shiroki et al.

FOREIGN PATENT DOCUMENTS

| JP | 7-86814 A | 3/1995 |
|---|---|---|
| JP | 2014-30173 A | 2/2014 |
| WO | 2012/073591 A1 | 6/2012 |

OTHER PUBLICATIONS

Official Communication issued in International Patent Application No. PCT/JP2015/063331, mailed on Jul. 21, 2015.

*Primary Examiner* — Stephen E Jones
(74) *Attorney, Agent, or Firm* — Keating & Bennett, LLP

(57) ABSTRACT

A high-frequency signal line includes a dielectric base with a first line portion and a second line portion each extending along a predetermined straight line parallel or substantially parallel to a predetermined direction, and a third line portion mutually connecting first side ends of the first line portion and the second line portion in the predetermined direction, a signal line, a first ground conductor located on the first side in the layer stacking direction of the signal line, a second ground conductor located on a second side in the layer stacking direction of the signal line, and one or more interlayer connection conductors connecting the first ground conductor and the second ground conductor. In the third line portion, the interlayer connection conductor is provided on the second side in the predetermined direction of the signal line when viewed from the layer stacking direction.

12 Claims, 18 Drawing Sheets

(51) Int. Cl.
*H01P 1/203* (2006.01)
*H05K 1/11* (2006.01)

(52) U.S. Cl.
CPC .............. *H05K 1/028* (2013.01); *H05K 1/111* (2013.01); *H05K 2201/093* (2013.01); *H05K 2201/0969* (2013.01); *H05K 2201/09236* (2013.01); *H05K 2201/09609* (2013.01); *H05K 2201/09727* (2013.01); *H05K 2201/10189* (2013.01)

(58) Field of Classification Search
USPC .................................................. 333/238, 246
See application file for complete search history.

FIG.13
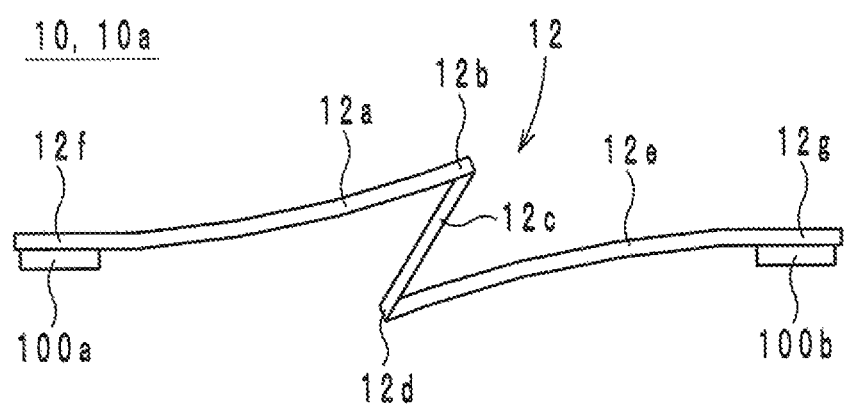
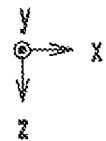

HIGH-FREQUENCY SIGNAL LINE AND ELECTRONIC DEVICE PROVIDED WITH THE SAME

BACKGROUND OF THE INVENTION

1. Field of the Invention

The present invention relates to a high-frequency signal line and an electronic device provided with the high-frequency signal line, and more particularly to a high-frequency signal line preferably for use for transmission of a high-frequency signal, and an electronic device provided with the high-frequency signal line.

2. Description of the Related Art

As an example of conventional inventions relating to high-frequency signal lines, a high-frequency signal line disclosed in WO2012/073591 is known. The high-frequency signal line includes a dielectric base, a signal line and two ground conductors. The dielectric base is formed by stacking a plurality of dielectric sheets. The signal line is provided in the dielectric base. The two ground conductors are provided on the dielectric base so as to sandwich the signal line from a layer stacking direction. Accordingly, the signal line and the two ground conductors form a stripline structure.

One of the ground conductors includes a plurality of openings arranged to overlap the signal line when viewed from the layer stacking direction. Accordingly, it is less likely that capacitance is generated between the signal line and one of the ground conductors. Hence, it is possible to reduce the distance in the layer stacking direction between the signal line and one of the ground conductors, thus resulting in a reduction in the thickness of the high-frequency signal line. Such a high-frequency signal line is used for connection between two circuit boards, for example.

In order to facilitate the operation of connecting two circuit boards on the high-frequency signal line disclosed in WO2012/073591, the center portion with respect to the lengthwise direction of the high-frequency signal line could be formed into a meandering shape. FIG. 20 illustrates a high-frequency signal line 500 of which center portion with respect to the lengthwise direction has a meandering shape. In FIG. 20, a signal line 504 and ground conductors 506 and 508 in and around a line portion 502b are indicated. FIG. 21 illustrates the high-frequency signal line 500 in a state in which both ends thereof are pulled.

As seen in FIG. 20, the center portion with respect to the right-left direction of the high-frequency signal line 500 has a meandering shape. Specifically, the high-frequency signal line 500 is formed of line portions 502a-502e connected together. The line portion 502a extends in the right-left direction. The line portion 502b extends downward from the right end of the line portion 502a. The line portion 502c extends leftward from the lower end of the line portion 502b. The line portion 502d extends downward from the left end of the line portion 502c. The line portion 502e extends rightward from the lower end of the line portion 502d.

The high-frequency signal line 500 is pulled when it is used to connect two circuit boards to each other. Specifically, the left end of the line portion 502a is pulled leftward, and the right end of the line portion 502e is pulled rightward. Then, as seen in FIG. 21, the high-frequency signal line 500 is transformed to a shape of a Z. Thus, the distance between connectors provided at both ends of the high-frequency signal line 500 is lengthened, which permits the two connectors to be connected to the respective two circuit boards easily.

Incidentally, it is difficult to satisfy both maintenance of the flexibility of the high-frequency signal line 500 and reduction of changes in the characteristic impedance of the high-frequency signal line 500. More specifically, in the high-frequency signal line 500, the signal line 504 and the two ground conductors 506 and 508 are embedded and form a stripline structure. The two ground conductors 506 and 508 are connected to each other by via-hole conductors which are not shown. In FIG. 20, the ground conductors 506 and 508 have the same shape and overlap each other in the layer stacking direction.

When the left end of the line portion 502a and the right end of the line portion 502e are pulled leftward and rightward respectively, the line portions 502b and 502d are twisted. Since the via-hole conductors are made of metal, the via-hole conductors are relatively rigid. Therefore, if a large number of via-hole conductors are provided in the line portions 502b and 502d, the deformation of the line portions 502b and 502d will be inhibited. Thus, the flexibility of the high-frequency signal line 500 will be lowered.

Then, it is considered that no via-hole conductors could be provided in the line portions 502b and 502d of the high-frequency signal line 500. In this case, however, the two ground conductors 506 and 508 cannot be connected to each other by via-hole conductors in the line portions 502b and 502d. Therefore, the potential of the ground conductors 506 and 508 in the line portions 502b and 502d will somewhat shift from the ground potential.

The center portion of the high-frequency signal line 500 has a meandering shape. Therefore, in the structure illustrated in FIG. 20, for example, the lower side of the line portion 502a and the left side of the line portion 502b are close to each other, and the portions of the ground conductors 506 and 508 near the lower side of the line portion 502a and near the left side of the line portion 502b are close to each other. As mentioned above, the potential of the portions of the ground conductors 506 and 508 near the left side of the line portion 502b somewhat shifts from the ground potential. Therefore, a potential difference is caused between the portions of the ground conductors 506 and 508 near the lower side of the line portion 502a and the portions of the ground conductors 506 and 508 near the left side of the line portion 502b, and as indicated in FIG. 20, floating capacitance is generated. Such floating capacitance causes the characteristic impedance of the high-frequency signal line 500 to shift from a predetermined value.

SUMMARY OF THE INVENTION

Preferred embodiments of the present invention provide a high-frequency signal line that satisfies both maintenance of flexibility of a dielectric base and reduction of changes in a characteristic impedance thereof, and an electronic device provided with the high-frequency signal line.

A high-frequency signal line according to a preferred embodiment of the present invention includes a flexible dielectric base including a plurality of dielectric sheets stacked in a stacking direction and includes a first line portion extending along a predetermined straight line parallel or substantially parallel to a predetermined direction, a second line portion extending along the predetermined straight line, and a third line portion connecting one side end of the first line portion in the predetermined direction and one side end of the second line portion in the predetermined direction; a signal line which extends along the first line portion, the second line portion, and the third line portion; a first ground conductor which is located on the one side in the layer stacking direction of the signal line in or on the dielectric base and extends along the signal line; a second ground conductor which is located on the other side in the layer stacking direction of the signal line in or on the dielectric base and extends along the signal line; and one or more interlayer connection conductors which pierce through the dielectric sheets and connect the first ground conductor and the second ground conductor, wherein, in the third line portion, the interlayer connection conductor is not provided on the one side in the predetermined direction of the signal line when viewed from the layer stacking direction but is provided on the other side in the predetermined direction of the signal line.

An electronic device according to a preferred embodiment of the present invention includes a case, and a high-frequency signal line stored in the case, the high-frequency signal line including a flexible dielectric base including a plurality of dielectric sheets stacked in the stacking direction and includes a first line portion extending along a predetermined straight line parallel or substantially parallel to a predetermined direction, a second line portion extending along the predetermined straight line, and a third line portion connecting one side end of the first line portion in the predetermined direction and one end of the second line portion in the predetermined direction; a signal line which extends along the first line portion, the second line portion, and the third line portion; a first ground conductor which is located on the one side in the layer stacking direction of the signal line in the dielectric base and extends along the signal line; a second ground conductor which is located on the other side in the layer stacking direction of the signal line in the dielectric base and extends along the signal line; and one or more interlayer connection conductors which pierce through the dielectric sheets and connect the first ground conductor and the second ground conductor, wherein, in the third line portion, the interlayer connection conductor is not provided on the one side in the predetermined direction of the signal line when viewed from the layer stacking direction but is provided on the other side in the determined direction of the signal line.

According to various preferred embodiments of the present invention, it is possible to satisfy both maintenance of flexibility of a dielectric base and reduction of changes in the characteristic impedance of a high-frequency signal line.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 13 illustrates a state of the high-frequency signal line when it is attached to circuit boards.

DETAILED DESCRIPTION OF THE PREFERRED EMBODIMENTS

High-frequency signal lines according to preferred embodiments of the present invention and electronic devices provided with the high-frequency signal lines will hereinafter be described with reference to the drawings.

Figure 1:
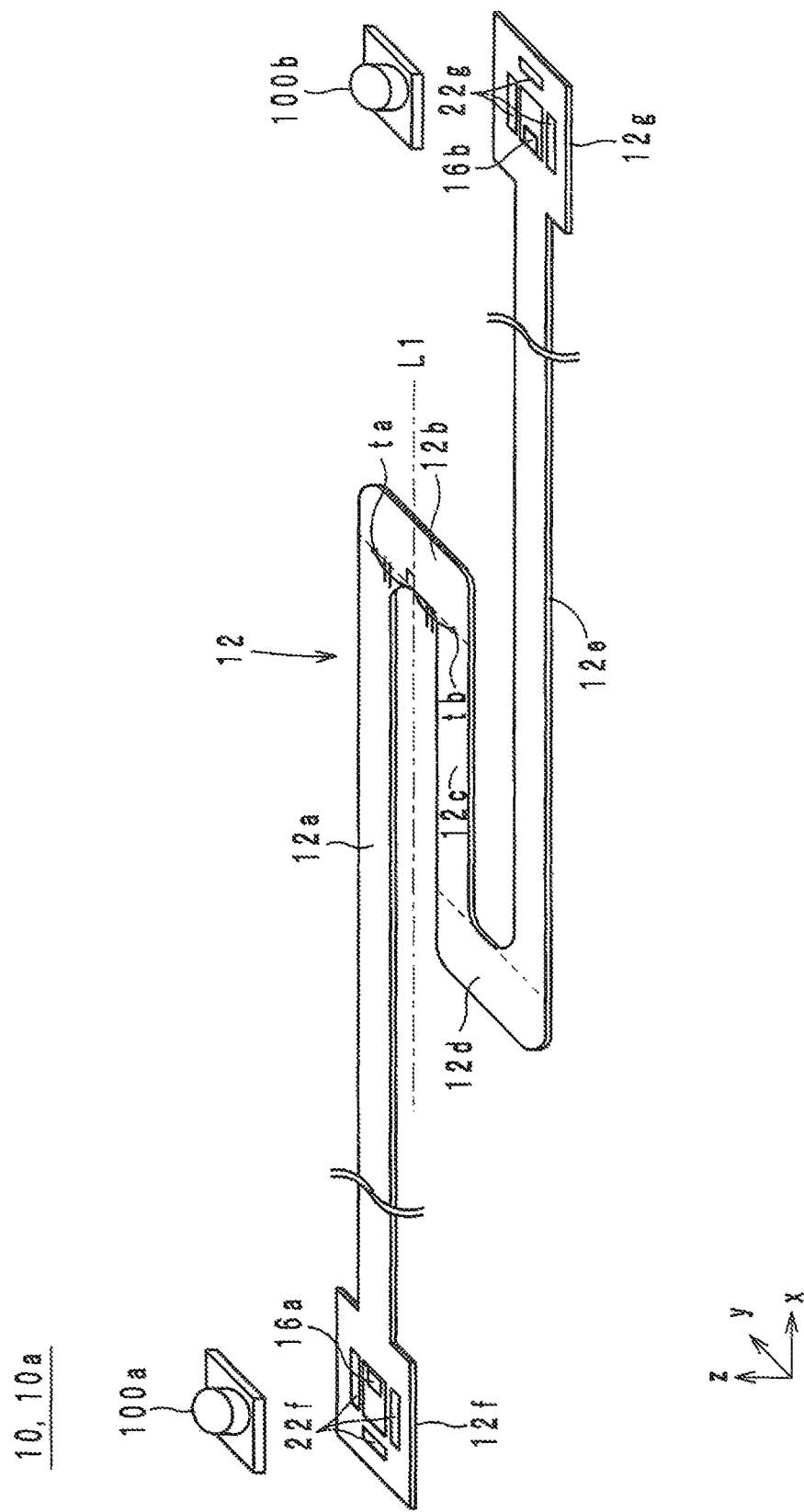
FIG. 1 is a perspective view of a high-frequency signal line according to a preferred embodiment of the present invention.
Figure 6:
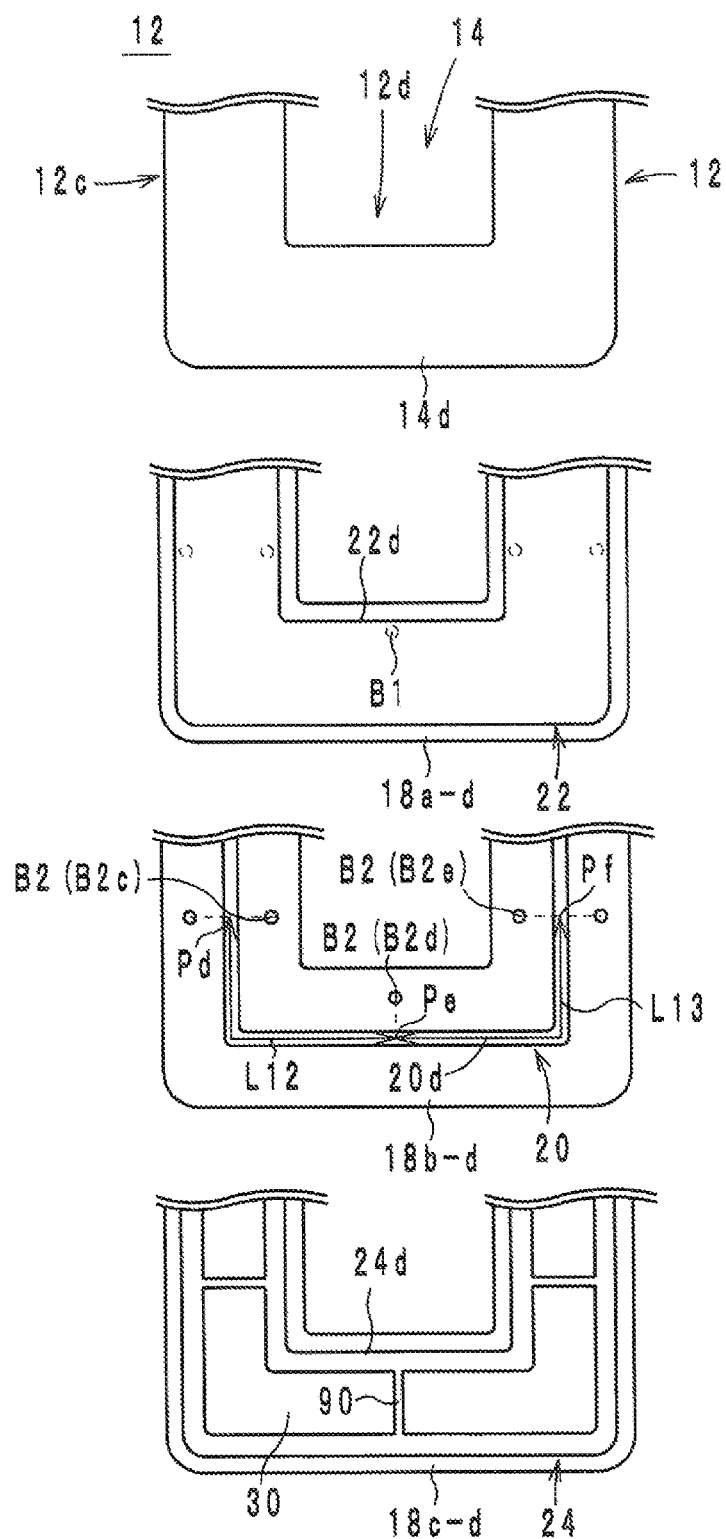
FIG. 6 is an exploded view of the high-frequency signal line illustrated in FIG. 1.
Figure 7:
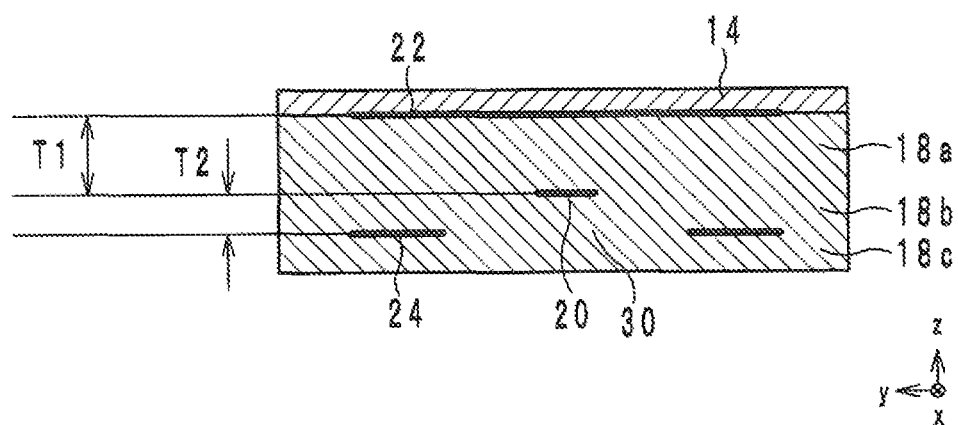
FIG. 7 is a sectional view of the high-frequency signal line cut along the line A-A indicated in FIG. 2.
Figure 8:
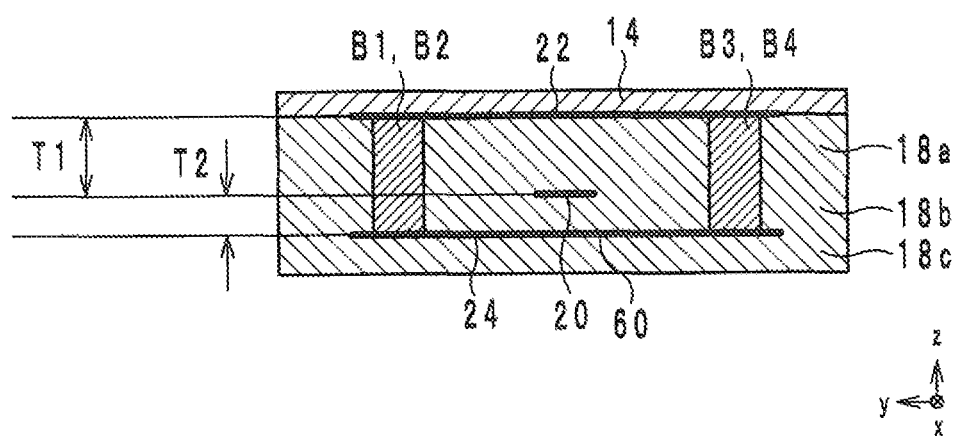
FIG. 8 is a sectional view of the high-frequency signal line cut along the line B-B indicated in FIG. 2.

A structure of the high-frequency signal line according to a preferred embodiment of the present invention is described below with reference to the drawings. FIG. 1 is a perspective view of the high-frequency signal line 10, 10a according to a preferred embodiment of the present invention. FIGS. 2-6 are exploded views of the high-frequency signal line 10 illustrated in FIG. 1. FIG. 7 is a sectional view of the high-frequency signal line 10 cut along the line A-A indicated in FIG. 2. FIG. 8 is a sectional view of the high-frequency signal line 10 cut along the line B-B indicated in FIG. 2. The direction in which layers of the high-frequency signal line 10 are stacked will hereafter be referred to as z-direction. The lengthwise direction of the high-frequency signal line 10 will hereinafter be referred to as x-direction, and the direction perpendicular to z-direction and x-direction will hereinafter be referred to as y-direction.

The high-frequency signal line 10 is preferably used, for example, in an electronic device such as a cell phone or the like to connect two high-frequency circuits to each other. As seen in FIGS. 1-8, the high-frequency signal line 10 includes a dielectric base 12, external terminals 16a and 16b, a signal line 20, a main ground conductor 22, an auxiliary ground conductor 24, via-hole conductors (interlayer connection conductors) b1, b2 and B1-B4, and connectors 100a and 100b.

As illustrated in FIG. 1, the dielectric base 12 is a flexible planar member extending in x-direction when viewed from z-direction, and the center portion thereof with respect to x-direction has a meandering shape. The dielectric base 12 includes line portions 12a through 12e, connection portions 12f and 12g. As seen in FIGS. 2-6, the dielectric base 12 is a stacked body including a protective layer 14 and dielectric sheets 18a through 18c stacked in this order from a positive side to a negative side in z-direction. The main surface of the dielectric base 12 on the positive side in z-direction will hereinafter be referred to as an obverse surface, and the main surface of the dielectric base 12 on the negative side in z-direction will hereinafter be referred to as a reverse surface. For the convenience of description of the shape of the dielectric base 12, an imaginary line parallel or substantially parallel to x-direction is defined as a straight line L1.

The line portion 12a (first line portion), as seen in FIG. 1, extends along the straight line L1. In this preferred embodiment, the line portion 12a is a strip-shaped portion extending parallel or substantially parallel to the straight line L1 and having a uniform or substantially uniform width (uniform measurement in y-direction). The line portion 12c (second line portion), as seen in FIG. 1, extends along the straight line L1. In this preferred embodiment, the line portion 12c is a strip-shaped portion extending parallel or substantially parallel to the straight line L1 and having a uniform or substantially uniform width (uniform measurement in y-direction). The straight line L1 (predetermined straight line) is an imaginary line and a perpendicular bisector of a line segment connecting a positive x-direction end ta of the line portion 12a and a positive x-direction end tb of the line portion 12c.

The line portion 12c is located on the negative side in y-direction of the line portion 12a. The positive x-direction end ta of the line portion 12a and the positive x-direction end tb of the line portion 12c lie side by side in y-direction. However, since the length of the line portion 12a is longer than the length of the line portion 12c, a negative x-direction end of the line portion 12a does not lie side by side with a negative x-direction end of the line portion 12c. The line portion 12b (third line portion) is a strip-shaped portion extending in y-direction and having a uniform or substantially uniform width (uniform measurement in x-direction). The line portion 12b connects the positive x-direction end of the line portion 12a and the positive x-direction end of the line portion 12c. The length of the line portion 12b is shorter than the length of the line portions 12a and 12c.

The line portion 12e (fourth line portion), as seen in FIG. 1, extends along the straight line L1. In this preferred embodiment, the line portion 12e is a strip-shaped portion extending parallel or substantially parallel to the straight line L1 and having a uniform or substantially uniform width (uniform measurement in y-direction). The line portion 12e is located on the negative side in y-direction of the line portion 12c. Thus, the line portion 12e is on the opposite side of the line portion 12a from the line portion 12c. The negative x-direction end of the line portion 12c and a negative x-direction end of the line portion 12e lie side by side in y-direction. However, since the length of the line portion 12e is longer than the length of the line portion 12c, the positive x-direction end of the line portion 12c does not lie side by side with a positive x-direction end of the line portion 12e. The line portion 12d (fifth line portion) is a strip-shaped portion extending in y-direction and having a uniform or substantially uniform width (uniform measurement in x-direction). The line portion 12d connects the negative x-direction end of the line portion 12c and the negative x-direction end of the line portion 12e. The length of the line portion 12d is shorter than the lengths of the line portions 12c and 12e. The widths (measurements in y-direction) of the line portions 12a, 12c and 12e and the widths (measurements in x-direction) of the line portions 12b and 12d are equal or substantially equal to one another. In FIG. 1, the borders between the line portions 12a through 12e are indicated by dashed lines.

The connection portions 12f and 12g are connected to the negative x-direction end of the line portion 12a and the positive x-direction end of the line portion 12e, respectively, and the connection portions 12f and 12g are rectangular or substantially rectangular when viewed from z-direction. The widths (measurements in y-direction) of the connection portions 12f and 12g are greater than the widths (measurements in y-direction) of the line portions 12a, 12c and 12e and greater than the widths (measurements in x-direction) of the line portions 12b and 12d.

As illustrated in FIGS. 2-6, the dielectric sheets 18a through 18c have the same plane shape as the dielectric base 12 when viewed from z-direction. The dielectric sheets 18a through 18c are made of flexible thermoplastic resin, such as polyimide, liquid polymer or the like. The main surface of each of the dielectric sheets 18a through 18c on the positive side in z-direction will hereinafter be referred to as an obverse surface, and the main surface of each of the dielectric sheets 18a through 18c on the negative side in z-direction will hereinafter be referred to as a reverse surface.

As seen in FIGS. 7 and 8, the thickness T1 of the dielectric sheet 18a is greater than the thickness T2 of the dielectric sheet 18b. After the dielectric sheets 18a through 18c are stacked, the thickness T1 is, for example, within a range from about 50 µm to about 300 µm. In this preferred embodiment, the thickness T1 preferably is about 100 µm, for example. The thickness T2 preferably is, for example, within a range from about 10 µm to about 100 µm. In this preferred embodiment, the thickness T2 preferably is about 50 µm, for example.

As seen in FIGS. 2 through 6, the dielectric sheet 18a includes line portions 18a-a through 18a-e, and connection portions 18a-f and 18a-g. The dielectric sheet 18b includes line portions 18b-a through 18b-e, and connection portions 18b-f and 18b-g. The dielectric sheet 18c includes line portions 18c-a through 18c-e, and connection portions 18c-f and 18c-g. The line portions 18a-a, 18b-a and 18c-a define the line portion 12a. The line portions 18a-b, 18b-b and 18c-b define the line portion 12b. The line portions 18a-c, 18b-c and 18c-c define the line portion 12c. The line portions 18a-d, 18b-d and 18c-d define the line portion 12d. The line portions 18a-e, 18b-e and 18c-e define the line portion 12e. The connection portions 18a-f, 18b-f and 18c-f define the connection portion 12f. The connection portions 18a-g, 18b-g and 18c-g define the connection portion 12g.

The signal line 20 transmits a high-frequency signal (electromagnetic waves), and as seen in FIGS. 2-6, the signal line extends along the line portions 12a through 12e and the connection portions 12f and 12g. That is, the signal line 20 is a linear conductor extending from the connection portion 12f to the connection portion 12g along the line portions 12a through 12e. In this preferred embodiment, the signal line 20 is provided on the obverse surface of the dielectric sheet 18b, and includes conductive traces 20a through 20f.

The conductive trace 20a extends in x-direction on the line portion 18b-a and is located in or substantially in the center with respect to y-direction of the line portion 18b-a. The conductive trace 20b extends in y-direction on the line portion 18*b-b* and is located in or substantially in the center with respect to x-direction of the line portion 18*b-b*. The conductive trace 20*c* extends in x-direction on the line portion 18*b-c* and is located in or substantially in the center with respect to y-direction of the line portion 18*b-c*. The conductive trace 20*d* extends in y-direction on the line portion 18*b-d* and is located in or substantially in the center with respect to x-direction of the line portion 18*b-d*. The conductive trace 20*e* extends in x-direction on the line portion 18*b-e* and located in or substantially in the center with respect to y-direction of the line portion 18*b-e*. The conductive traces 20*a* through 20*e* are connected serially in this order.

Figure 2:
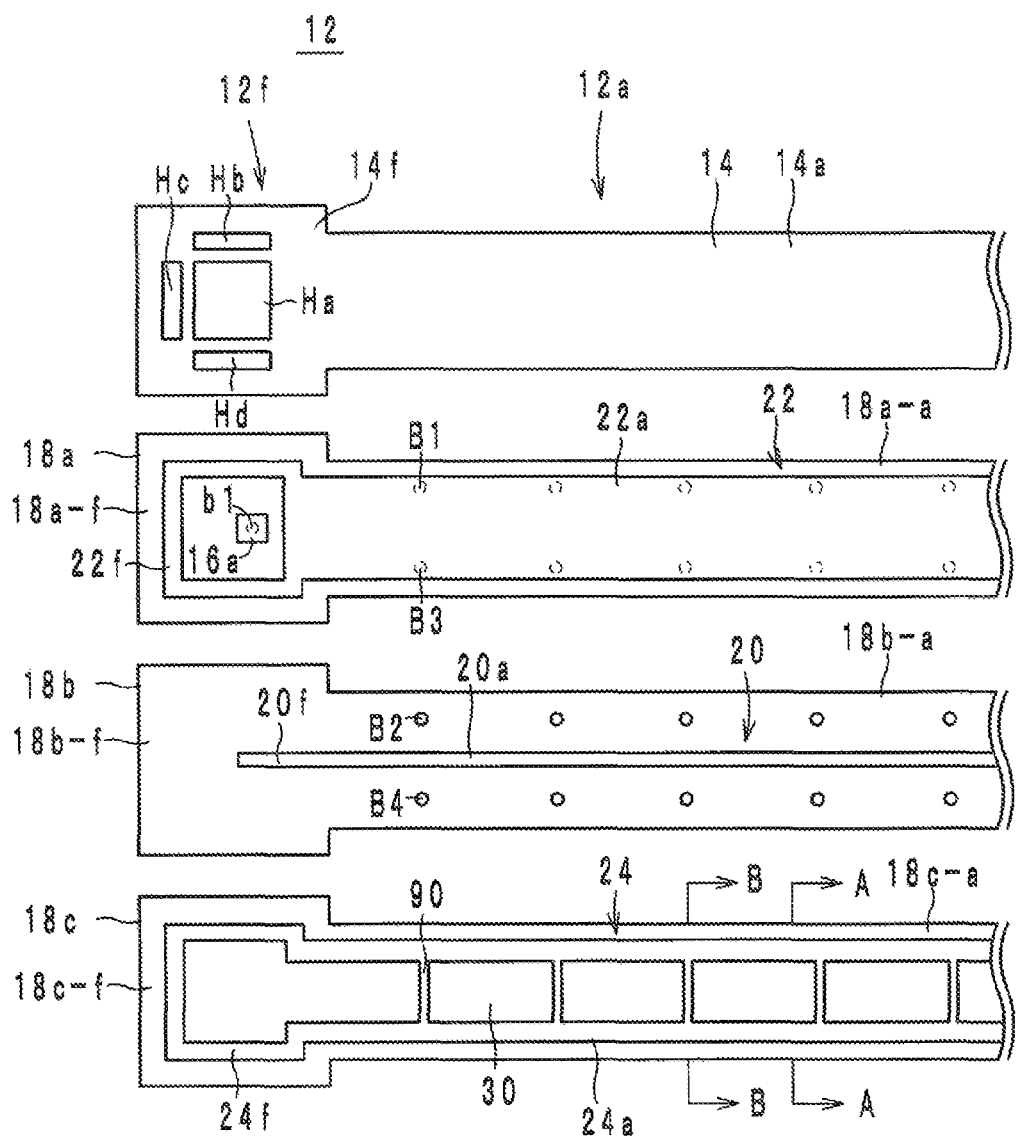
FIG. 2 is an exploded view of the high-frequency signal line illustrated in FIG. 1.
Figure 3:
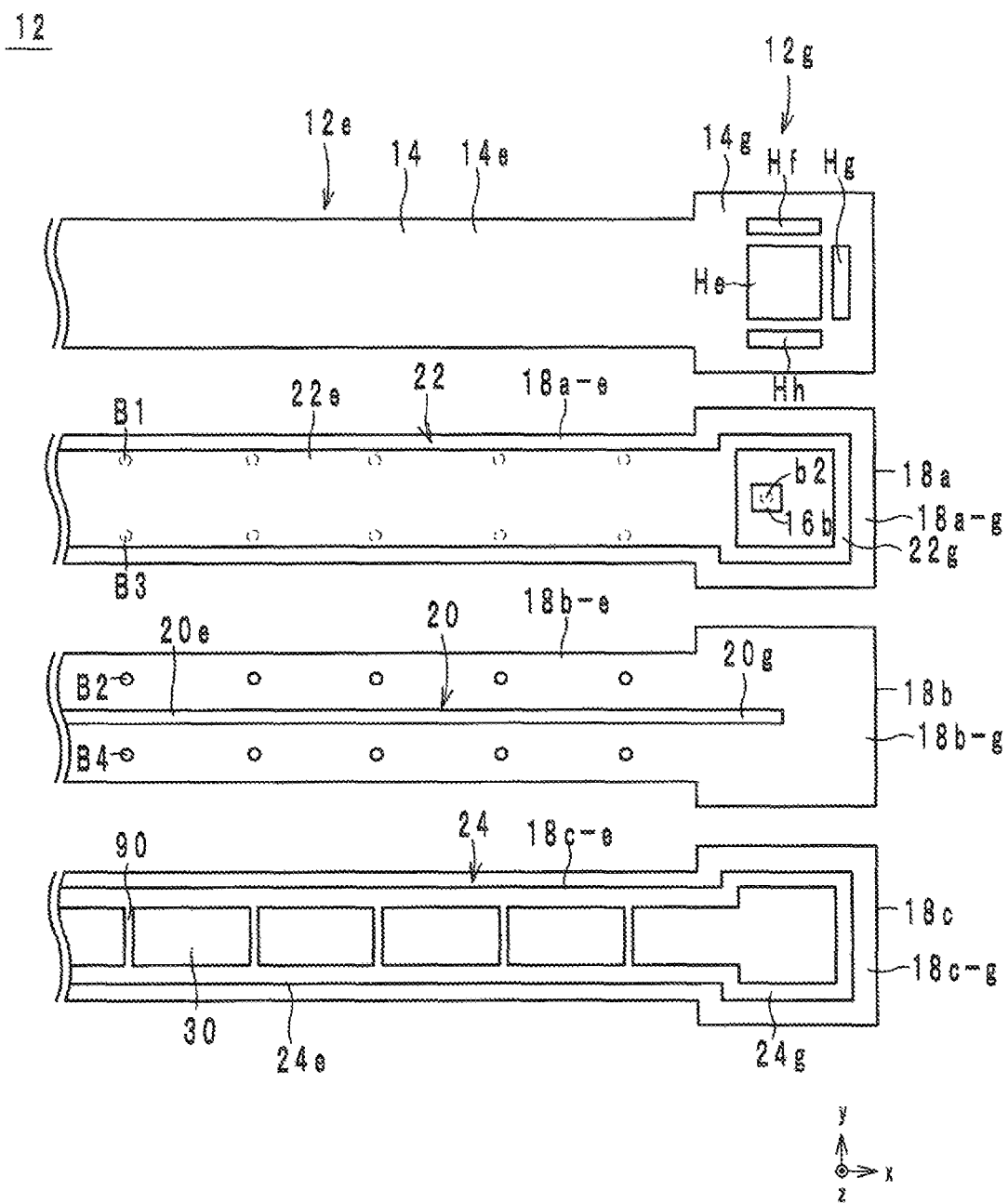
FIG. 3 is an exploded view of the high-frequency signal line illustrated in FIG. 1.

The conductive trace 20*f* is connected to a negative x-direction end of the conductive trace 20*a* and extends in x-direction on the connection portion 18*b-f*. As seen in FIG. 2, a negative x-direction end of the conductive trace 20*f* is located in or substantially in the center of the connection portion 18*b-f*. The conductive trace 20*g* is connected to a positive x-direction end of the conductive trace 20*e* and extends in x-direction on the connection portion 18*b-g*. As seen in FIG. 3, a positive x-direction end of the conductive trace 20*g* is located in or substantially in the center of the connection portion 18*b-g*.

The line width of the signal line 20 preferably is, for example, within a range from about 300 μm to about 700 μm. In this preferred embodiment, the line width of the signal line 20 preferably is about 300 μm, for example. The signal line 20 is made of a low-specific-resistance metallic material mainly containing silver, copper or the like. The statement that the signal line 20 is formed on the obverse surface of the dielectric sheet 18*b* means that the signal line 20 preferably is formed by patterning a metal foil formed by plating on the obverse surface of the dielectric sheet 18*b*, or that the signal line 20 preferably is formed by patterning a metal foil applied on the obverse surface of the dielectric sheet 18*b*. The surface of the signal line 20 is smoothened, and therefore, the surface of the signal line 20 in contact with the dielectric sheet 18*b* has a greater surface roughness than the surface of the signal line 20 out of contact with the dielectric sheet 18*b*.

As seen in FIGS. 2 through 6, the main ground conductor 22 is a conductive layer, which has no openings, provided in an area farther in the positive z-direction than the signal line 20 on the dielectric base 12, and extends along the signal line 20. In this preferred embodiment, the main ground conductor 22 is formed on the obverse surface of the dielectric sheet 18*a* and faces the signal line 20 via the dielectric sheet 18*a*. The main ground conductor 22 has no openings in a portion over the signal line 20. The characteristic impedance of the high-frequency signal line 10 is decided dominantly based on the square measure of an area where the signal line 20 and the main ground conductor 22 face each other, the distance between the signal line 20 and the main ground conductor 22, and the relative permittivity of the dielectric sheets 18*a* through 18*c*. When the characteristic impedance of the high-frequency signal line 10 is desired to be about 50Ω, for example, the signal line 20 and the main ground conductor 22 are designed such that the characteristic impedance of the high-frequency signal line 10 determined from the signal line 20 and the main ground conductor 22 becomes about 55Ω, which is a little higher than the desired value of about 50Ω. Then, the shape of the auxiliary ground conductor 24, which will be described later, is adjusted such that the characteristic impedance of the high-frequency signal line 10 determined from the signal line 20, the main ground conductor 22 and the auxiliary ground conductor 24 becomes about 50Ω, for example.

The main ground conductor 22 is made of a low-specific-resistance metallic material mainly containing silver, copper or the like. The statement that the main ground conductor 22 is formed on the obverse surface of the dielectric sheet 18*a* means that the main ground conductor 22 is formed preferably by patterning a metal foil formed by plating the obverse surface of the dielectric sheet 18*a* and or that the main ground conductor 22 is formed preferably by patterning a metal foil applied on the obverse surface of the dielectric sheet 18*a*. The surface of the main ground conductor 22 is smoothened, and therefore, the surface of the main ground conductor 22 in contact with the dielectric sheet 18*a* has a greater surface roughness than the surface of the main ground conductor 22 out of contact with the dielectric sheet 18*a*.

As seen in FIGS. 2 through 6, the main ground conductor 22 includes main conductive portions 22*a* through 22*e* and terminal conductive portions 22*f* and 22*g*. The main conductive portion 22*a* is provided on the obverse surface of the line portion 18*a-a* and extends in x-direction. The main conductive portion 22*b* is provided on the obverse surface of the line portion 18*a-b* and extends in y-direction. The main conductive portion 22*c* is provided on the obverse surface of the line portion 18*a-c* and extends in x-direction. The main conductive portion 22*d* is provided on the obverse surface of the line portion 18*a-d* and extends in y-direction. The main conductive portion 22*e* is provided on the obverse surface of the line portion 18*a-e* and extends in x-direction. The main conductive portions 22*a* through 22*e* are connected serially in this order.

The terminal conductive portion 22*f* is provided on the obverse surface of the connection portion 18*a-f* and is in the shape of a rectangular or substantially rectangular loop. The terminal conductive portion 22*f* is connected to a negative x-direction end of the main conductive portion 22*a*. The terminal conductive portion 22*g* is provided on the obverse surface of the connection portion 18*a-g* and is in the shape of a rectangular or substantially rectangular loop. The terminal conductive portion 22*g* is connected to a positive x-direction end of the main conductive portion 22*e*.

As seen in FIGS. 2 through 6, the auxiliary ground conductor 24 is provided in the dielectric base 12, on the negative side in z-direction of the signal line 20, and extends along the signal line 20. More specifically, the auxiliary ground conductor 24 is formed on the obverse surface of the dielectric sheet 18*c* and faces the signal line 20 via the dielectric sheet 18*b*. The auxiliary ground conductor 24 includes a plurality of openings 30 arranged along the signal line 20. The auxiliary ground conductor 24 also defines and functions as a shield. The main surface of the auxiliary ground conductor 24 on the positive side in z-direction will hereinafter be referred to as an obverse surface, and the main surface of the auxiliary ground conductor 24 on the negative side in z-direction will hereinafter be referred to as a reverse surface.

The auxiliary ground conductor 24 is made of a low-specific-resistance metallic material mainly containing silver or copper. The statement that the auxiliary ground conductor 24 is formed on the obverse surface of the dielectric sheet 18*c* means that the auxiliary ground conductor 24 is formed preferably by patterning a metal foil formed by plating on the obverse surface of the dielectric sheet 18*c* or that the auxiliary ground conductor 24 is formed preferably by patterning a metal foil applied on the obverse surface of the dielectric sheet 18*c*. The surface of the auxiliary ground conductor 24 is smoothened, and therefore, the surface of the auxiliary ground conductor 24 in contact with the dielectric sheet 18c has a greater surface roughness than the surface of the auxiliary ground conductor 24 out of contact with the dielectric sheet 18c.

As seen in FIGS. 2 through 6, the auxiliary ground conductor 24 includes main conductive portions 24a through 24e and terminal conductive portions 24f and 24g. The main conductive portion 24a is provided on the obverse surface of the line portion 18c-a and extends in x-direction. The main conductive portion 24b is provided on the obverse surface of the line portion 18c-b and extends in y-direction. The main conductive portion 24c is provided on the obverse surface of the line portion 18c-c and extends in x-direction. The main conductive portion 24d is provided on the obverse surface of the line portion 18c-d and extends in y-direction. The main conductive portion 24e is provided on the obverse surface of the line portion 18c-e and extends in x-direction. The main conductive portions 24a through 24e are connected serially in this order.

The terminal conductive portion 24f is provided on the obverse surface of the connection portion 18c-f and is in the shape of a truncated rectangular or substantially rectangular loop. The terminal conductive portion 24f is connected to a negative x-direction end of the main conductive portion 24a. The terminal conductive portion 24g is provided on the obverse surface of the connection portion 18c-g and is in the shape of a truncated rectangular or substantially rectangular loop. The terminal conductive portion 24g is connected to a positive x-direction end of the main conductive portion 24e.

As seen in FIGS. 2 through 6, the main conductive portions 24a through 24e have a plurality of rectangular or substantially rectangular openings 30, each extending along the signal line 20. Portions among the openings 30 on the main conductive portions 24a through 24e are referred to as bridges 90. Each of the bridges 90 is a linear conductive portion extending in a direction perpendicular or substantially perpendicular to the signal line 20. Thus, the main conductive portions 24a through 24e define a ladder shape. When viewed from z-direction, the plurality of openings 30 and the plurality of bridges 90 overlap the signal line 20 alternately. In this preferred embodiment, the signal line 20 extends crossing the openings 30 and the bridges 90.

As mentioned above, the auxiliary ground conductor 24 is designed for fine adjustment of the characteristic impedance of the high-frequency signal line 10. More specifically, the auxiliary ground conductor 24 is designed such that the characteristic impedance of the high-frequency signal line 10 will be about 50Ω. Also, the interval between two adjacent bridges 90 of the auxiliary ground conductor 24 is designed to cause no radiation noise within a usable band.

As thus far described, the signal line 20 is sandwiched between the main ground conductor 22 and the auxiliary ground conductor 24 with respect to z-direction. Accordingly, the signal line 20, the main ground conductor 22 and the auxiliary ground conductor 24 define a triplate-type stripline structure. As seen in FIGS. 7 and 8, the distance in z-direction between the signal line 20 and the main ground conductor 22 is equal or substantially equal to the thickness T1 of the dielectric sheet 18a, and for example, within a range from about 50 μm to about 300 μm. In this preferred embodiment, the distance between the signal line 20 and the main ground conductor 22 preferably is about 100 μm, for example. On the other hand, as seen in FIGS. 7 and 8, the distance in z-direction between the signal line 20 and the auxiliary ground conductor 24 is equal or substantially equal to the thickness T2 of the dielectric sheet 18b, and for example, within a range from about 10 μm to about 100 μm. In this preferred embodiment, the distance between the signal line 20 and the auxiliary ground conductor 24 preferably is about 50 μm, for example. Thus, the distance in z-direction between the auxiliary ground conductor 24 and the signal line 20 is designed to be smaller than the distance in z-direction between the main ground conductor 22 and the signal line 20.

As seen in FIGS. 1 through 3, the external terminal 16a is a rectangular or substantially rectangular conductor located in or substantially in the center of the obverse surface of the connection portion 18a-f. Therefore, when viewed from z-direction, the external terminal 16a overlaps the negative x-direction end of the conductive trace 20f of the signal line 20. As seen in FIGS. 1 through 3, the external terminal 16b is a rectangular or substantially rectangular conductor located in or substantially in the center of the obverse surface of the connection portion 18a-g. Therefore, when viewed from z-direction, the external terminal 16b overlaps the positive x-direction end of the conductive trace 20g of the signal line 20.

The external terminals 16a and 16b preferably are formed by plating an obverse surface of a low-specific-resistance metallic material mainly containing silver and copper with Ni/Au. The statement that the external terminals 16a and 16b are formed on the obverse surface of the dielectric sheet 18a means that the external terminals 16a and 16b are formed by patterning a metal foil formed preferably by plating the obverse surface of the dielectric sheet 18a or that the external terminals 16a and 16b are formed by patterning a metal foil applied on the obverse surface of the dielectric sheet 18a. The surfaces of the external terminals 16a and 16b are smoothened, and therefore, the surfaces of the external terminals 16a and 16b in contact with the dielectric sheet 18a have a greater surface roughness than the surfaces of the external terminals 16a and 16b out of contact with the dielectric sheet 18a.

As seen in FIG. 2, the via-hole conductor b1 pierces through the connection portion 18a-f of the dielectric sheet 18a in z-direction and connects the external terminal 16a to the negative x-direction end of the conductive trace 20f. As seen in FIG. 3, the via-hole conductor b2 pierces through the connection portion 18a-g of the dielectric sheet 18a in z-direction and connects the external terminal 16b to the positive x-direction end of the conductive trace 20g. Thus, the signal line 20 is connected between the external terminals 16a and 16b. The via-hole conductors b1 and b2 are formed preferably by filling through holes made in the dielectric sheet 18a with a metallic material.

Figure 4:
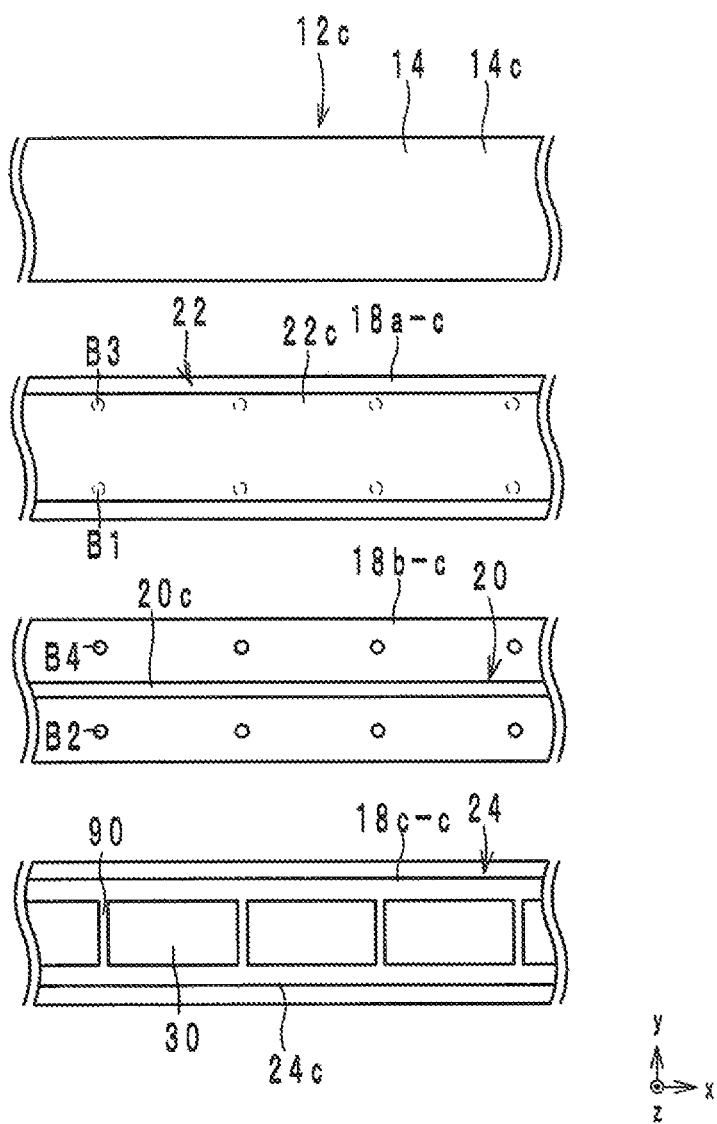
FIG. 4 is an exploded view of the high-frequency signal line illustrated in FIG. 1.
Figure 5:
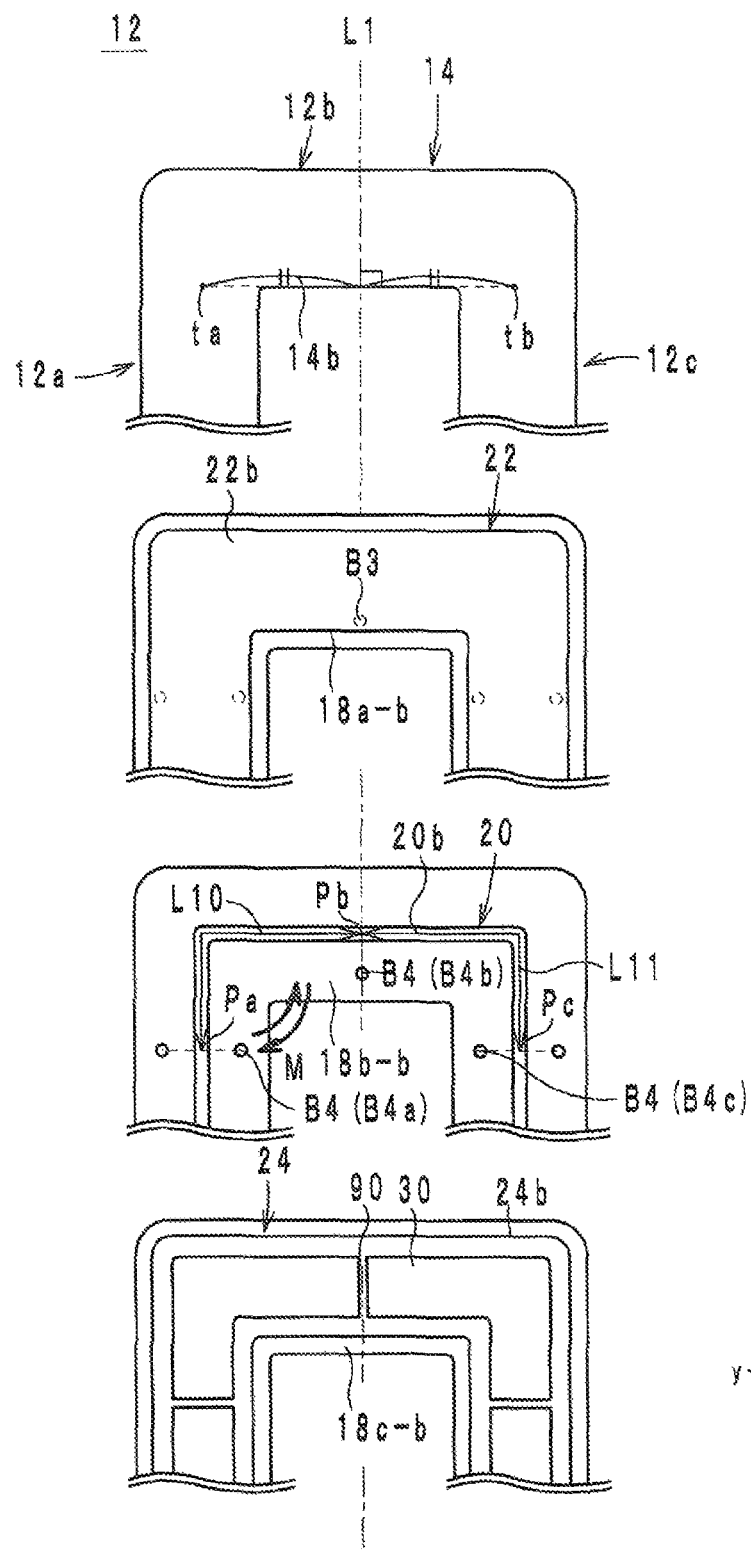
FIG. 5 is an exploded view of the high-frequency signal line illustrated in FIG. 1.

The plurality of via-hole conductors B1, as seen in FIGS. 2 through 5, pierce through the line portions 18a-a, 18a-c, 18a-d and 18a-e in z-direction. In the line portions 18a-a and 18a-e, as seen in FIGS. 2 and 3, the plurality of via-hole conductors B1 are provided on the positive side in y-direction of the bridges 90, and are arranged in a line in x-direction. In the line portion 18a-c, as seen in FIG. 4, the plurality of via-hole conductors B1 are provided on the negative side in y-direction of the bridges 90, and are arranged in a line in x-direction. In the line portion 18a-d, as seen in FIG. 6, the via-hole conductors B1 are provided on the positive side in x-direction of the bridge 90. In the line portion 18a-b, as seen in FIG. 5, none of the via-hole conductors B1 is provided.

The plurality of via-hole conductors B2, as seen in FIGS. 2 through 5, pierce through the line portions 18b-a, 18b-c, 18b-d and 18b-e in z-direction. In the line portions 18b-a and 18b-e, as seen in FIGS. 2 and 3, the plurality of via-hole conductors B2 are provided on the positive side in y-direction of the bridges 90, and are arranged in a line in x-direction. In the line portion 18b-c, as seen in FIG. 4, the plurality of via-hole conductors B2 are provided on the negative side in y-direction of the bridges 90, and are arranged in a line in x-direction. In the line portion 18b-d, as seen in FIG. 6, the via-hole conductor B2 are provided on the positive side in x-direction of the bridge 90. In the line portion 18b-b, as seen in FIG. 5, none of the via-hole conductors B2 is provided.

Each of the via-hole conductors B1 and each of the via-hole conductors B2 are connected to each other to define one via-hole conductor to connect the main ground conductor 22 to the auxiliary ground conductor 24. The via-hole conductors B1 and B2 are formed preferably by filling through holes made in the dielectric sheets 18a and 18b with a metallic material.

The plurality of via-hole conductors B3, as seen in FIGS. 2 through 4 and 6, pierce through the line portions 18a-a, 18a-b, 18a-c and 18a-e in z-direction. In the line portions 18a-a and 18a-e, as seen in FIGS. 2 and 3, the plurality of via-hole conductors B3 are located on the negative side in y-direction of the bridges 90, and are arranged in a line in x-direction. In the line portion 18a-c, as seen in FIG. 4, the plurality of via-hole conductors B3 are provided on the positive side in y-direction of the bridges 90, and are arranged in a line in x-direction. In the line portion 18a-b, as seen in FIG. 5, the via-hole conductors B3 are provided on the negative side in x-direction of the bridges 90. In the line portion 18a-d, as seen in FIG. 6, none of the via-hole conductors B3 is provided.

The plurality of via-hole conductors B4, as seen in FIGS. 2 through 4 and 6, pierce through the line portions 18b-a, 18b-b, 18b-c and 18b-e in z-direction. In the line portions 18b-a and 18b-e, as seen in FIGS. 2 and 3, the plurality of via-hole conductors B4 are provided on the negative side in y-direction of the bridges 90, and are arranged in a line in x-direction. In the line portion 18b-c, as seen in FIG. 4, the plurality of via-hole conductors B4 are provided on the positive side in y-direction of the bridges 90, and are arranged in a line in x-direction. In the line portion 18b-b, as seen in FIG. 5, the via-hole conductors B4 are provided on the negative side in x-direction of the bridges 90. In the line portion 18b-d, as seen in FIG. 6, none of the via-hole conductors B4 is provided.

Each of the via-hole conductors B3 and each of the via-hole conductors B4 are connected to each other to define one via-hole conductor to connect the main ground conductor 22 to the auxiliary ground conductor 24. The via-hole conductors B3 and B4 are formed preferably by filling through holes made in the dielectric sheets 18a and 18b with a metallic material.

As described above and as seen in FIG. 5, the line portion 12b has no via-hole conductors B1 and B2 but has via-hole conductors B3 and B4. Accordingly, when viewed from z-direction, in the line portion 12b, via-hole conductors are provided on the negative side in x-direction of the conductive trace 20b, while no via-hole conductors are provided on the positive side in x-direction of the conductive trace 20b.

Also, as seen in FIG. 6, the line portion 12d has no via-hole conductors B3 and B4 but has via-hole conductors B1 and B2. Accordingly, when viewed from z-direction, in the line portion 12d, via-hole conductors are provided on the positive side in x-direction of the conductive trace 20d, while no via-hole conductors are provided on the negative side in x-direction of the conductive trace 20d.

As seen in FIG. 5, in the line portion 12a, the via-hole conductor B4 provided closest to the positive x-direction end of the line portion 12a is denoted by via-hole conductor B4a. In the line portion 12b, the via-hole conductor B4 provided closest to the line portion 12a is denoted by via-hole conductor B4b. Then, the length L10 from the point Pa of the signal line 20 closest to the via-hole conductor B4a to the point Pb of the signal line 20 closest to the via-hole conductor B4b is equal to or less than a quarter wavelength of a high-frequency signal (electromagnetic waves) to be transmitted through the signal line 20.

As seen in FIG. 5, in the line portion 12c the via-hole conductor B4 provided closest to the positive x-direction end of the line portion 12c is denoted by via-hole conductor B4c. In the line portion 12b, the via-hole conductor B4 provided closest to the line portion 12c is denoted by via-hole conductor B4b. Then, the length L11 from the point Pc of the signal line 20 closest to the via-hole conductor B4c to the point Pb of the signal line 20 closest to the via-hole conductor B4b is equal to or less than a quarter wavelength of a high-frequency signal (electromagnetic waves) to be transmitted through the signal line 20.

As seen in FIG. 6, in the line portion 12c, the via-hole conductor B2 provided closest to the negative x-direction end of the line portion 12c is denoted by via-hole conductor B2c. In the line portion 12d, the via-hole conductor B2 provided closest to the line portion 12c is denoted by via-hole conductor B2d. Then, the length L12 from the point Pd of the signal line 20 closest to the via-hole conductor B2c to the point Pe of the signal line 20 closest to the via-hole conductor B2d is equal to or less than a quarter wavelength of a high-frequency signal (electromagnetic waves) to be transmitted through the signal line 20.

As seen in FIG. 6, in the line portion 12e, the via-hole conductor B2 provided closest to the negative x-direction end of the line portion 12e is denoted by via-hole conductor B2e. In the line portion 12e, the via-hole conductor B2 provided closest to the line portion 12e is denoted by via-hole conductor B2d. Then, the length L13 from the point Pf of the signal line 20 closest to the via-hole conductor B2e to the point Pe of the signal line 20 closest to the via-hole conductor B2d is equal to or less than a quarter wavelength of a high-frequency signal (electromagnetic waves) to be transmitted through the signal line 20.

The protective layer 14 is an insulating layer covering the entire or substantially the entire obverse surface of the dielectric sheet 18a. Accordingly, the protective layer 14 covers the main ground conductor 22. The protective layer 14 is made of flexible resin, such as a resist material or the like.

As seen in FIG. 2, the protective layer 14 includes line portions 14a through 14e and connection portions 14f and 14g. The line portions 14a through 14e cover the entire obverse surfaces of the line portions 18a-a through 18a-e, respectively, and accordingly cover the main conductive portions 22a through 22e, respectively.

The connection portion 14f is connected to the negative x-direction end of the line portion 14a and covers the obverse surface of the connection portion 18a-f. However, the connection portion 14f includes openings Ha through Hd. The opening Ha is a rectangular or substantially rectangular opening made in the center of the connection portion 14f. The external terminal 16a is exposed to the outside through the opening Ha. The opening Hb is a rectangular or substantially rectangular opening provided on the positive side in y-direction of the opening Ha. The opening Hc is a rectangular or substantially rectangular opening provided on the negative side in x-direction of the opening Ha. The opening Hd is a rectangular or substantially rectangular opening provided on the negative side in y-direction of the opening Ha. The terminal conductive portion 22f is exposed to the outside through the openings Hb through Hd and defines and functions as an external terminal.

The connection portion 14g is connected to the positive x-direction end of the line portion 14e and covers the obverse surface of the connection portion 18a-g. However, the connection portion 14g includes openings He through Hh. The opening He is a rectangular or substantially rectangular opening made in the center of the connection portion 14g. The external terminal 16b is exposed to the outside through the opening He. The opening Hf is a rectangular or substantially rectangular opening provided on the positive side in y-direction of the opening He. The opening Hg is a rectangular or substantially rectangular opening provided on the positive side in x-direction of the opening He. The opening Hh is a rectangular or substantially rectangular opening provided on the negative side in y-direction of the opening He. The terminal conductive portion 22g is exposed to the outside through the openings Hf through Hh and defines and functions as an external terminal.

In the high-frequency signal line 10 having the structure above, the characteristic impedance of the high-frequency signal line 10 changes cyclically between an impedance Z1 and an impedance Z2. More specifically, in areas where the signal line 20 overlaps the openings 30, the small capacitance is generated between the signal line 20 and the main ground conductor 22 and the small capacitance is generated between the signal line 20 and the auxiliary ground conductor 24. Accordingly, in the areas where the signal line 20 overlaps the openings 30, the characteristic impedance exhibits the impedance Z1, which is relatively high.

On the other hand, in areas where the signal line 20 overlaps the bridges 90, the relatively large capacitance is generated between the signal line 20 and the main ground conductor 22 and the relatively large capacitance is generated between the signal line 20 and the auxiliary ground conductor 24 are relatively large. Accordingly, in the areas where the signal line 20 overlaps the bridges 90, the characteristic impedance exhibits the impedance Z2, which is relatively low. The openings 30 and the bridges 90 are arranged alternately along the signal line 20. Therefore, the characteristic impedance of the high-frequency signal line 10 changes cyclically between the impedance Z1 and the impedance Z2. The impedance Z1 is, for example, about 55Ω, and the impedance Z2 is, for example, about 45Ω. Then, the average characteristic impedance of the whole signal line 20 is, for example, about 50Ω.

Figure 9:
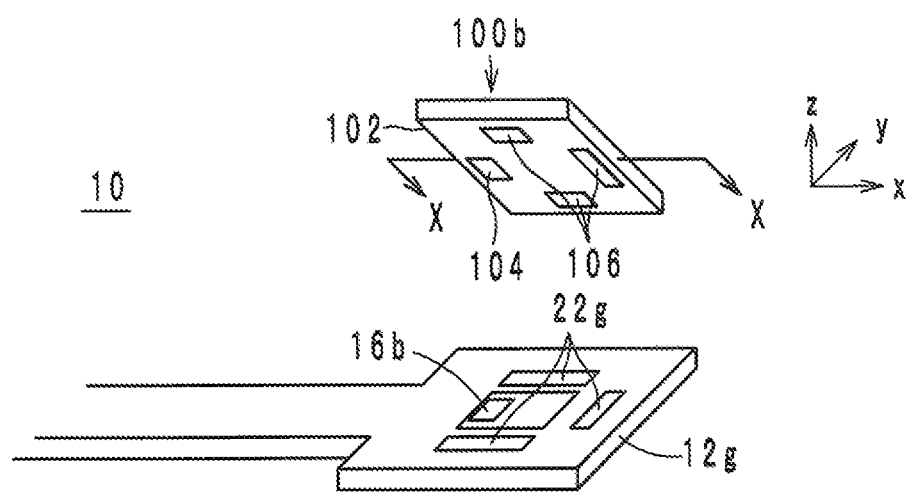
FIG. 9 is a perspective view of a connector of the high-frequency signal line.
Figure 10:
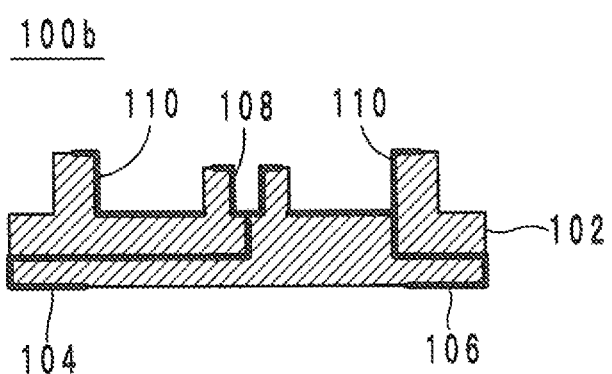
FIG. 10 is a sectional view of the connector.

The connectors 100a and 100b are, as seen in FIG. 1, mounted on the obverse surfaces of the connection portions 12f and 12g, respectively. Since the connectors 100a and 100b have the same structure, the structure of the connector 100b will hereinafter be described as an example. FIG. 9 is a perspective view of the connector 100b of the high-frequency signal line 10. FIG. 10 is a sectional view of the connector 100b.

As seen in FIGS. 9 and 10, the connector 100b includes a connector body 102, external terminals 104 and 106, a central conductor 108 and an external conductor 110. The connector body 102 is in the shape of a rectangular or substantially rectangular plate with a cylindrical portion connected thereon. The connector body 102 is made of an insulating material, such as resin or the like.

The external terminal 104 is provided on the negative side in z-direction of the plate of the connector body 102 and in a position to face the external terminal 16b. The external terminal 106 is provided on the negative side in z-direction of the plate of the connector body 102 and in a position to face the terminal conductive portion 22g exposed through the openings Hf through Hh.

The central conductor 108 is located in the center of the cylindrical portion of the connector body 102 and is connected to the external terminal 104. The central conductor 108 is a signal terminal for input/output of a high-frequency signal. The external conductor 110 is provided on an inner surface of the cylindrical portion of the connector body 102 and is connected to the external terminal 106. The external conductor 110 is a ground terminal that is maintained at a ground potential.

The connector 100b having the structure above is, as illustrated in FIG. 9, mounted on the obverse surface of the connection portion 12g such that the external terminal 104 is connected to the external terminal 16b and such that the external terminal 106 is connected to the terminal conductive portion 22g. Thus, the signal line 20 is electrically connected to the central conductor 108. Also, the main ground conductor 22 and the auxiliary ground conductor 24 are electrically connected to the external conductor 110.

Figure 11:
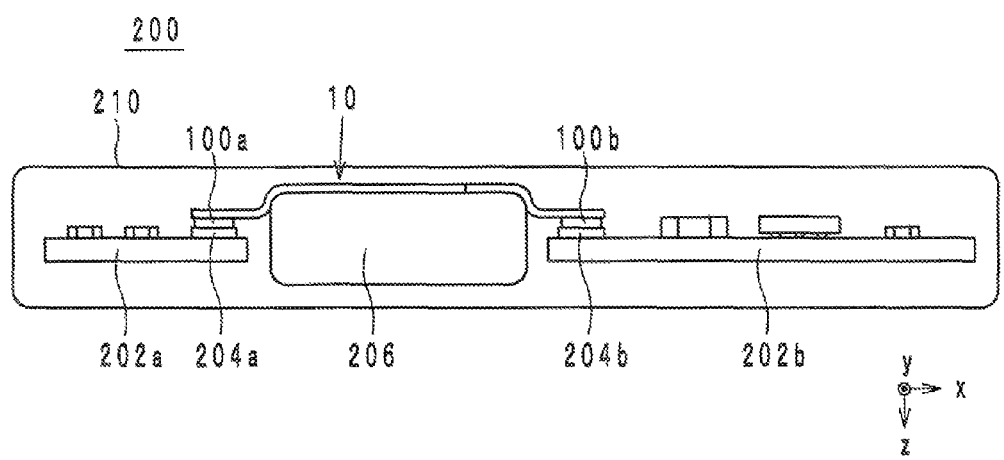
FIG. 11 is a plan view from y-direction of an electronic device using the high-frequency signal line.
Figure 12:
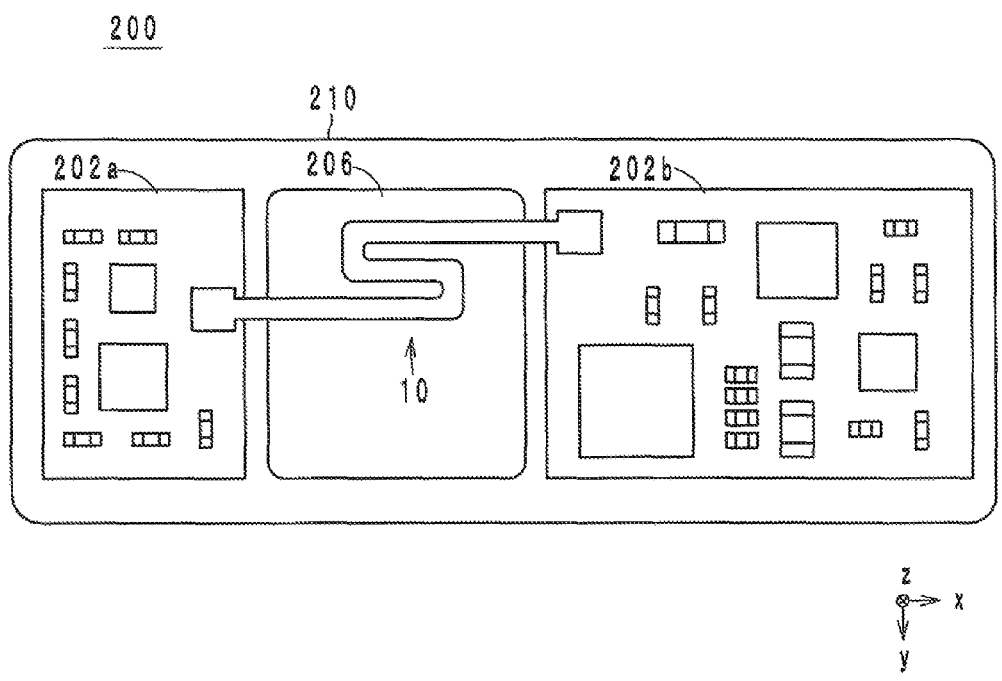
FIG. 12 is a plan view from z-direction of the electronic device using the high-frequency signal line.

The high-frequency signal line 10 is used as follows. FIG. 11 is a plan view from y-direction of an electronic device 200 using the high-frequency signal line 10. FIG. 12 is a plan view from z-direction of the electronic device 200 using the high-frequency signal line 10. FIG. 13 illustrates a state of the high-frequency signal line 10 when it is attached to circuit boards 202a and 202b.

As seen in FIGS. 11 and 12, the high-frequency signal line 10 is used in the electronic device 200. The electronic device 200 includes circuit boards 202a and 202b, connectors 204a and 204b, a battery pack (metal object) 206 and a case 210 as well as the high-frequency signal line 10.

The case 210 contains the high-frequency signal line 10, the circuit boards 202a and 202b, the connectors 204a and 204b and the battery pack 206. In or on the circuit board 202a, for example, a sending circuit or a receiving circuit including an antenna is provided. In or on the circuit board 202b, for example, a feeding circuit is provided. The battery pack 206 is, for example, a lithium-ion secondary battery, and a metal cover covers the surface of the battery pack 206. The circuit board 202a, the battery pack 206 and the circuit board 202b are arranged in this order from the negative side to the positive side in x-direction.

The connectors 204a and 204b are provided on main surfaces of the circuit boards 202a and 202b, respectively, which are on the negative side in z-direction. The connectors 100a and 100b are connected to the connectors 204a and 204b, respectively. Thus, a high-frequency signal having a frequency of 2 GHz, for example, to be transmitted between the circuit boards 202a and 202b are applied to the central conductors 108 of the connectors 100a and 100b through the connectors 204a and 204b. Also, the external conductors 110 of the connectors 100a and 100b are maintained at the ground potential through the circuit boards 202a and 202b, and the connectors 204a and 204b. Thus, the high-frequency signal line 10 connects the circuit boards 202a and 202b to each other.

In this state, the obverse surface of the dielectric base 12 (more exactly, the protective layer 14) is in contact with the battery pack 206, and the dielectric base 12 is fixed to the battery pack 206 by an adhesive or the like. The obverse surface of the dielectric base 12 is the main surface thereof located by the side of the main ground conductor 22 in relation to the signal line 20. Accordingly, the main ground conductor 22, which has no openings, lies between the signal line 20 and the battery pack 206.

When the high-frequency signal line 10 is fitted to the circuit boards 202a and 202b, the connector 100a is pulled to the negative side in x-direction, and the connector 100b is pulled to the positive side in x-direction. Thus, the line portion 12a is pulled to the negative side in x-direction, and the line portion 12e is pulled to the positive side in x-direction. Accordingly, the positive x-direction end of the line portion 12c is pulled to the negative side in x-direction by the line portion 12a via the line portion 12b. The negative x-direction end of the line portion 12c is pulled to the positive side in x-direction by the line portion 12e via the line portion 12d. Consequently, the line portion 12c turns counterclockwise when viewed from the positive side in y-direction, and the line portions 12b and 12d are twisted and deformed. By these motions, the distance between the connectors 100a and 100b in a stretched state as illustrated in FIG. 13 is longer than the distance between the connectors 100a and 100b in an unstretched state as illustrated in FIG. 1. The length of the high-frequency signal line 10 can be adjusted in this way, and therefore, it is available to easily attach the connectors 100a and 100b to the connectors 204a and 204b, respectively.

A non-limiting examples of a method of manufacturing the high-frequency signal line 10 will hereinafter be described with reference to FIGS. 2 through 6. In the following, a method of manufacturing one high-frequency signal line 10 will be described as an example. Practically, however, a plurality of high-frequency signal lines 10 are produced at a time by stacking and cutting large dielectric sheets.

First, dielectric sheets made of thermoplastic resin and having a copper film (metal film) on the entire obverse surface are prepared as the dielectric sheets 18a through 18c. Specifically, copper films are stuck on the respective obverse surfaces of the dielectric sheets 18a through 18c. Further, the obverse surface of the copper films on the dielectric sheets 18a through 18c are galvanized for anticorrosion and are smoothened. The dielectric sheets 18a through 18c are liquid crystal polymer. The thicknesses of the copper films are in a range from about 10 μm to about 20 μm, for example.

Next, the copper film formed on the obverse surface of the dielectric sheet 18a is patterned such that the external terminals 16a and 16b, and the main ground conductor 22 as illustrated in FIGS. 2 through 6 are formed on the dielectric sheet 18a. Specifically, on the copper film formed on the obverse surface of the dielectric sheet 18a, resists having the same shapes as the external terminals 16a and 16b, and the main ground conductor 22 illustrated in FIGS. 2 through 6 are printed. Then, the copper film is etched, and thus, the portions of the copper film not covered with the resists are removed. Thereafter, a resist remover is sprayed to remove the resists. In this way, the external terminals 16a and 16b, and the main ground conductor 22 as illustrated in FIGS. 2 through 6 are formed on the obverse surface of the dielectric sheet 18a by photolithography.

Next, the signal line 20 as illustrated in FIGS. 2 through 6 is formed on the obverse surface of the dielectric sheet 18b. Further, the auxiliary ground conductor 24 as illustrated in FIGS. 2 through 6 is formed on the obverse surface of the dielectric sheet 18c. The process of forming the signal line 20 and the process of forming the auxiliary ground conductor 24 are the same as the process of forming the external terminals 16a and 16b, and the main ground conductor 22, and descriptions of these processes are omitted.

Next, through holes are made in the dielectric sheets 18a and 18b by irradiating the dielectric sheets 18a and 18b with a laser beam, on points where the via-hole conductors b1, b2 and B1 through B4 are to be formed. The via-hole conductors b1 and b2, and B1 through B4 are formed by filling through holes with a conductive paste.

Next, the dielectric sheets 18a through 18c are stacked in this order from the positive side to the negative side in z-direction, and thus, the dielectric base 12 is formed. Thereafter, heat and pressure are applied to the stack of dielectric sheets 18a through 18c from the positive side and from the negative side in z-direction, and thus, the dielectric sheets 18a through 18c are bonded together.

Next, resin (resist) paste is applied to the obverse surface of the dielectric sheet 18a using a screen printing, and thus, the protective layer 14 covering the main ground conductor 22 is formed on the obverse surface of the dielectric sheet 18a.

Lastly, the connector 100a is mounted on the external terminal 16a and the terminal conductive portion 22f on the connection portion 12f with solder, and the connector 100b is mounted on the external terminal 16b and the terminal conductive portion 22g on the connection portion 12g with solder. In this way, the high-frequency signal line 10 as illustrated in FIG. 1 is produced.

In the high-frequency signal line 10 having the structure above, both maintenance of the flexibility of the dielectric base 12 and reduction of changes in the characteristic impedance of a high-frequency signal line 10 can be satisfied. More specifically, in order to deform the line portion 12b easily, it is preferred that no via-hole conductors are provided in the line portion 12b. However, in a case in which no via-hole conductors are provided in the line portion 12b, floating capacitance is likely to be generated, for example, between the main conductive portions 22a and 22b, between the main conductive portions 24a and 24b, between the main conductive portions 22b and 22c, and between the main conductive portions 24b and 24c. Such floating capacitance causes the characteristic impedance of the high-frequency signal line 10 to shift from the predetermined characteristic impedance.

When the line portion 12b of the high-frequency signal line 10 is viewed from z-direction, the via-hole conductors B3 and B4 are provided farther in the negative x-direction than the signal line 20. Accordingly, the portions of the main conductive portions 22b and 24b located farther in the negative x-direction than the signal line 20 have a potential closer to the ground potential. Therefore, it is less likely that a potential difference is generated between the main conductive portions 22a and 22b and between the main conductive portions 24a and 24b. Also, it is less likely that a potential difference is generated between the main conductive portions 22b and 22c and between the main conductive portions 24b and 24c. Accordingly, it is less likely that floating capacitance is generated between the main conductive portions 22a and 22b and between the main conductive portions 24a and 24b, and it is less likely that floating capacitance is generated between the main conductive portions 22b and 22c and between the main conductive portions 24b and 24c. For the same reason, in the line portion 12d, the risk of a shift of the characteristic impedance of the high-frequency signal line 10 from a predetermined characteristic impedance is significantly reduced.

When the line portion 12b of the high-frequency signal line 10 is viewed from z-direction, no via-hole conductors are provided in an area farther in the positive x-direction than the signal line 20. Accordingly, the number of via-hole conductors provided in the line portion 12b is reduced, and it is unlikely that deformation of the line portion 12b is blocked by via-hole conductors. For the same reason, it is unlikely that deformation of the line portion 12d is blocked by via-hole conductors. As thus far described, the high-frequency signal line 10 satisfies both maintenance of the flexibility of the dielectric base 12 and reduction of changes in the characteristic impedance of the high-frequency signal line 10.

Also, the high-frequency signal line 10 is able to be made thinner. More specifically, in the high-frequency signal line 10, the auxiliary ground conductor 24 has openings 30, and accordingly, it is less likely that capacitance is generated between the signal line 20 and the auxiliary ground conductor 24. Accordingly, even if the distance in z-direction between the signal line 20 and the auxiliary ground conductor 24 is set smaller, the capacitance between the signal line 20 and the auxiliary ground conductor 24 will not be too large. Therefore, the characteristic impedance of the high-frequency signal line 10 is less likely to shift from a predetermined characteristic impedance (for example, about 50Ω). Thus, the high-frequency signal line 10 is able to be made thinner while the characteristic impedance of the high-frequency signal line 10 is maintained at a predetermined characteristic impedance.

Since the square measure of the auxiliary ground conductor 24 is smaller than that of the main ground conductor 22, the electric potential of the auxiliary ground conductor 24 is more likely to shift from the ground potential than the electric potential of the main ground conductor 22. Therefore, via-hole conductors are provided in the line portion 12b, which prevents a potential difference from being generated in the line portion 12b between the main ground conductor 22 and the auxiliary ground conductor 24.

Also, even when the high-frequency signal line 10 is stuck on the battery pack 206 or any other metal object, it is unlikely that the characteristic impedance of the high-frequency signal line 10 shifts. More specifically, the high-frequency signal line 10 is stuck on the battery pack 206 such that the main ground conductor 22, which has no openings, is located between the signal line 20 and the battery pack 206. Accordingly, there is no possibility that the signal line 20 and the battery pack 206 face each other via openings, and it is unlikely that capacitance is generated between the signal line 20 and the battery pack 206. Consequently, a drop of the characteristic impedance of the high-frequency signal line 10 due to sticking of the high-frequency signal line 10 on the battery pack 206 is prevented.

It is unlikely that the high-frequency signal line 10 radiates noise from the line portions 12b and 12d and the adjacent portions thereof in x-direction and in y-direction. This will hereinafter be described, taking the line portion 12b as an example. As illustrated in FIG. 5, around the points Pa and Pb, the signal line 20 is close to the via-hole conductors B4a and Bob, respectively, and therefore, capacitances are generated between the signal line 20 and the via-hole conductor B4a and between the signal line 20 and the via-hole conductor Bob. Accordingly, the characteristic impedances of the high-frequency signal line 10 at the points Pa and Pb are lower than the characteristic impedance in the portion between the points Pa and Pb. Therefore, in the points Pa and Pb, reflection of a high-frequency signal occurs, and a standing wave having antinodes at the points Pa and Pb occurs between the points Pa and Pb. Such a standing wave may cause noise.

In order to prevent this problem, in the high-frequency signal line 10, the length L10 from the point Pa of the signal line 20 to the point Pb of the signal line 20 is equal to or less than a quarter wavelength of a high-frequency signal (electromagnetic waves) to be transmitted through the signal line 20. Accordingly, generation of a standing wave between the points Pa and Pb can be prevented. Therefore, radiation of noise from the line portion 12b and the adjacent portion thereof in x-direction and in y-direction is significantly reduced. For the same reason, radiation of noise from the line portion 12d and the adjacent portion thereof in x-direction and in y-direction is significantly reduced.

In the high-frequency signal line 10, also, it is unlikely that noise taps into a high-frequency signal transmitted through the signal line 20 in the line portions 12b and 12d and the adjacent portions thereof. This will hereinafter be described, taking the line portion 12b and the adjacent portion thereof as an example.

The signal line 20 is sandwiched between the main ground conductor 22 and the auxiliary ground conductor 24 from both sides in z-direction, which prevents noise from being radiated from the signal line 20 in z-direction. On the other hand, there are only via-hole conductors in x-direction and in y-direction of the signal line 20, and therefore, it is likely that noise is radiated from the signal line 20 in x-direction and y-direction.

Around a portion where the line portion 12a and the line portion 12b are connected, the conductive trace 20a in the line portion 12a and the conductive trace 20b in the line portion 12b are located close to each other. Accordingly, as indicated by arrow M in FIG. 5, if noise is radiated from the line portion 12a in x-direction and y-direction, the noise may trap into a high-frequency signal transmitted through the line portion 12b. Likewise, as indicated by arrow M in FIG. 5, if noise is radiated from the line portion 12b in x-direction and y-direction, the noise may trap into a high-frequency signal transmitted through the line portion 12a. Then, the line portions 12a and 12b may be electromagnetically coupled, thus resulting in a transmission loss.

In order to prevent this problem, in the high-frequency signal line 10, the length L10 from the point Pa of the signal line 20 to the point Pb of the signal line 20 is equal to or less than a quarter wavelength of a high-frequency signal to be transmitted through the signal line 20. Accordingly, it is unlikely that a standing wave having a frequency equal to or less than twice the frequency of a high-frequency signal line to be transmitted through the signal line 20 is generated between the points Pa and Pb. For the same reason, it is unlikely that a standing wave having a frequency equal to or less than twice the frequency of a high-frequency signal to be transmitted through the signal line 20 is generated between the points Pb and Pc. For example, when the frequency of a high-frequency signal to be transmitted through the signal line 20 is 2 GHz, it is unlikely that a standing wave having a frequency equal to or less than 4 GHz is generated. When the frequency of a high-frequency signal to be transmitted through the signal line 20 is 2 GHz, it means that a high-frequency signal having a frequency band of 1 GHz to 3 GHz is transmitted through the signal line 20. Therefore, preventing generation of a standing wave having a frequency equal to or less than 4 GHz leads to preventing generation of noise having a frequency within the frequency band of a high-frequency signal to be transmitted through the signal line 20. Hence, in the high-frequency signal line 10, it is unlikely that noise taps into a high-frequency signal transmitted through the signal line 20 in the line portion 12b and the adjacent portion thereof. For the same reason, it is unlikely that noise taps into a high-frequency signal transmitted through the signal line 20 in the line portion 12d and the adjacent portion thereof.

The structure of a high-frequency signal line according to a first modification of a preferred embodiment of the present invention will hereinafter be described with reference to the drawings. FIGS. 14 through 18 are exploded views of the high-frequency signal line 10a according to a second modification of a preferred embodiment of the present invention. The perspective view of the high-frequency signal line 10a according to the first modification is as illustrated in FIG. 1.

The high-frequency signal line 10a differs from the high-frequency signal line 10 in the shapes of the signal line 20 and the auxiliary ground conductor 24. The high-frequency signal line 10a will hereinafter be described, focusing on the differences.

Figure 14:
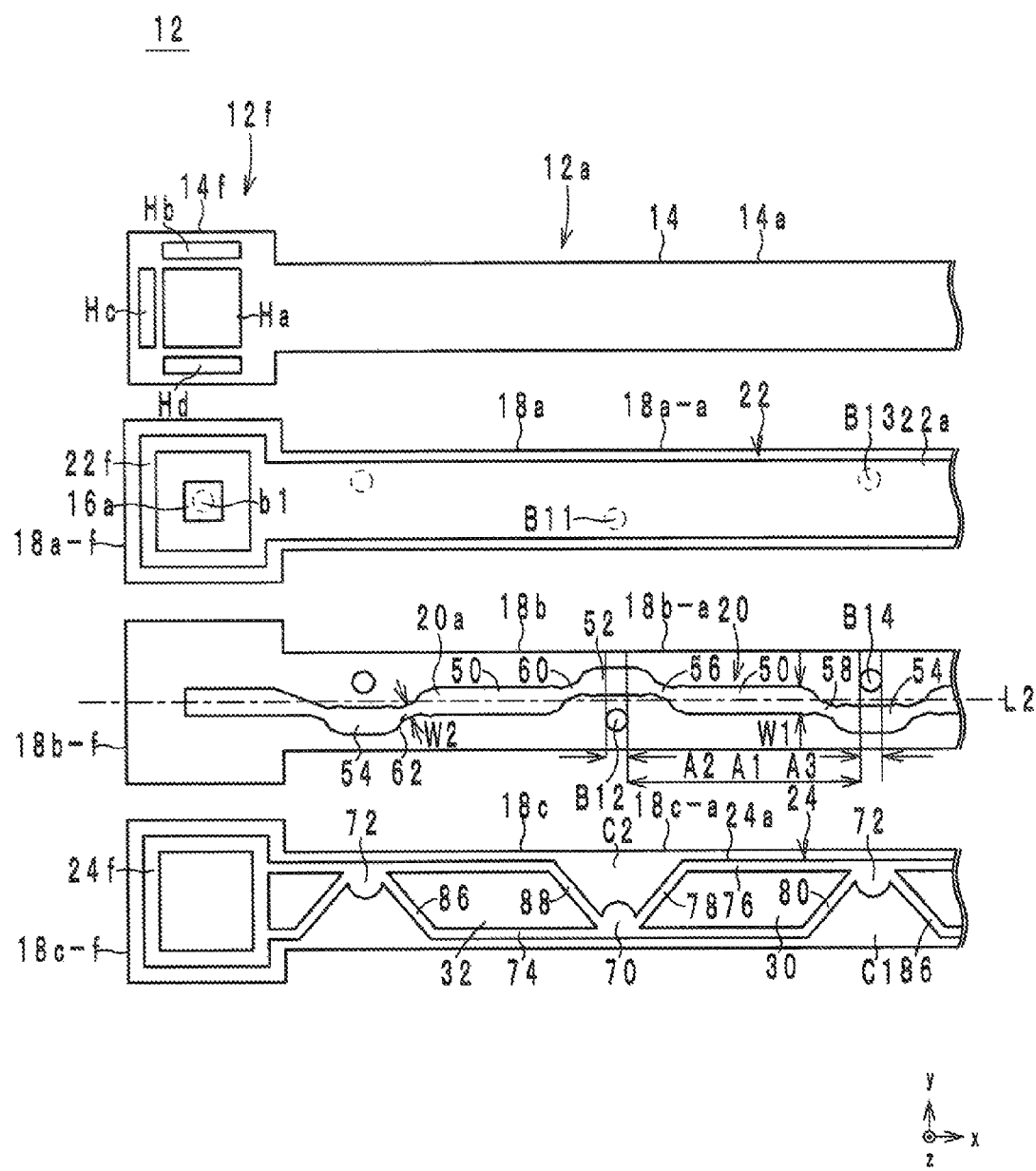
FIG. 14 is an exploded view of a high-frequency signal line according to a first modification of a preferred embodiment of the present invention.
Figure 15:
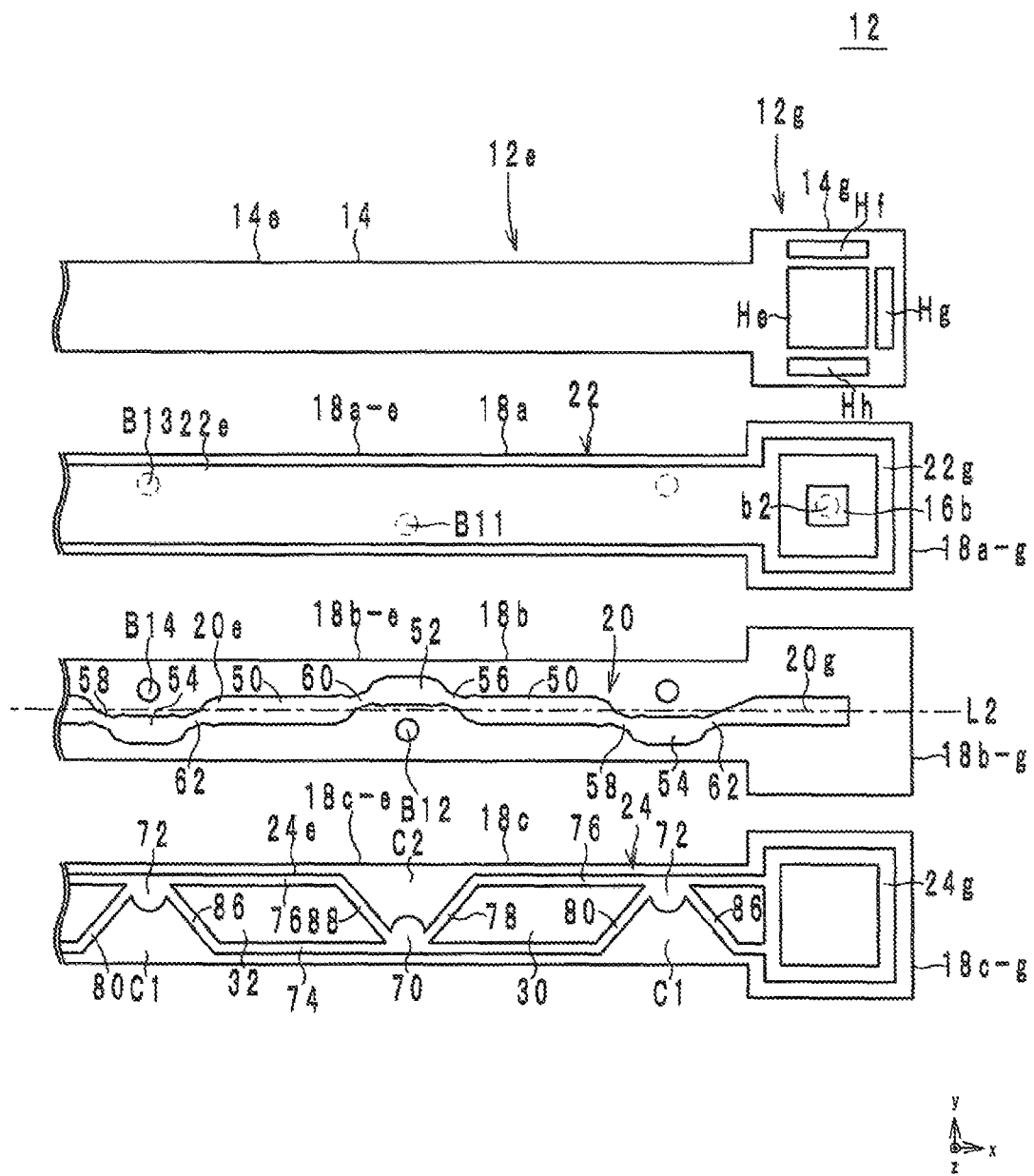
FIG. 15 is an exploded view of the high-frequency signal line according to the first modification of a preferred embodiment of the present invention.

As seen in FIGS. 14 and 15, in the main conductive portions 24a and 24e of the auxiliary ground conductor 24, a plurality of parallelogram openings 30 and 32, each of which extends in x-direction, are provided. More specifically, each of the main conductive portions 24a and 24e includes a plurality of connection portions 70 and 72, sides 74 and 76, and a plurality of bridges 78, 80, 86 and 88. The side 74 is a linear conductor defining a side of the main conductive portion 24a on the negative side in y-direction and extends in x-direction. The side 76 is a linear conductor defining a side of the main conductive portion 24a on the positive side in y-direction and extends in x-direction. Each of the connection portions 70 is semicircular and protrudes from the side 74 to the positive side in y-direction. The plurality of connection portions 70 are arranged in a line in x-direction at uniform intervals. Each of the connection portions 72 is semicircular and protrudes from the side 76 to the negative side in y-direction. The plurality of connection portions 72 are arranged in a line in x-direction at uniform intervals. The connection portions 70 and the connection portions 72 are located in different positions with respect to x-direction. In this preferred embodiment, the connection portions 70 and the connection portions 72 are arranged alternately in x-direction. Each of the connection portions 72 is located on the middle point between adjacent two connection portions 70 with respect to x-direction. Each of the connection portions 70 is located on the middle point between adjacent two connection portions 72 with respect to x-direction.

The bridges 78 are linear conductors extending from the connection portions 70 diagonally to the positive side in y-direction and to the positive side in x-direction and connected to the side 76. The bridges 80 are linear conductors extending from the connection portions 72 diagonally to the negative side in y-direction and to the negative side in x-direction and connected to the side 74. The bridges 78 and 80 are parallel or substantially parallel to each other. Accordingly, the openings 30 are located in the area enclosed by the sides 74 and 76, and the bridges 78 and 80.

The bridges 86 are linear conductors extending from the connection portions 72 diagonally to the negative side in y-direction and to the positive side in x-direction and connected to the side 74. The bridges 88 are linear conductors extending from the connection portions 70 diagonally to the positive side in y-direction and to the negative side in x-direction and connected to the side 76. The bridges 86 and 88 are parallel or substantially parallel to each other. Accordingly, the openings 32 are located in the area enclosed by the sides 74 and 76, and the bridges 86 and 88.

In each of the main conductive portions 24a and 24e, the side 74 has cutouts C1. The cutouts C1 are provided on the negative side in y-direction of the respective connection portions 72 in the main conductive portions 24a and 24e. Accordingly, the side 74 is divided by the cutouts C1.

In each of the main conductive portions 24a and 24e, the side 76 has cutouts C2. The cutouts C2 are provided on the positive side in y-direction of the respective connection portions 70 in the main conductive portions 24a and 24e. Accordingly, the side 76 is divided by the cutouts C2.

Figure 16:
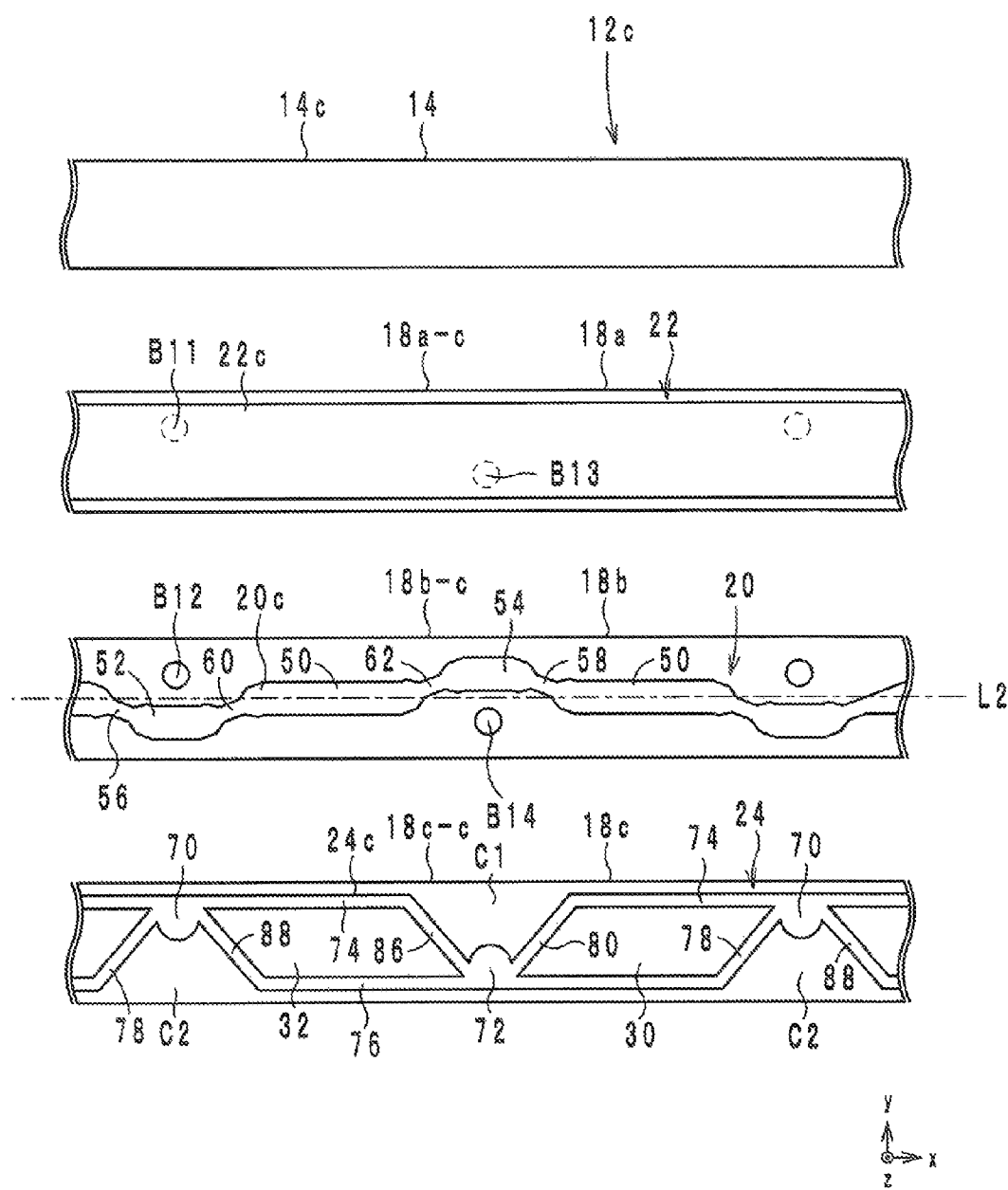
FIG. 16 is an exploded view of the high-frequency signal line according to the first modification of a preferred embodiment of the present invention.

As seen in FIG. 16, the plurality of parallelogram openings 30 and 32, each of which extends in x-direction, are provided in the main conductive portion 24c of the auxiliary ground conductor 24. The main conductive portion 24c has a structure in which the main conductive portions 24a and 24e are rotated by 180 degrees about the z-axis. Therefore, the description of the main conductive portion 24c is omitted.

Figure 17:
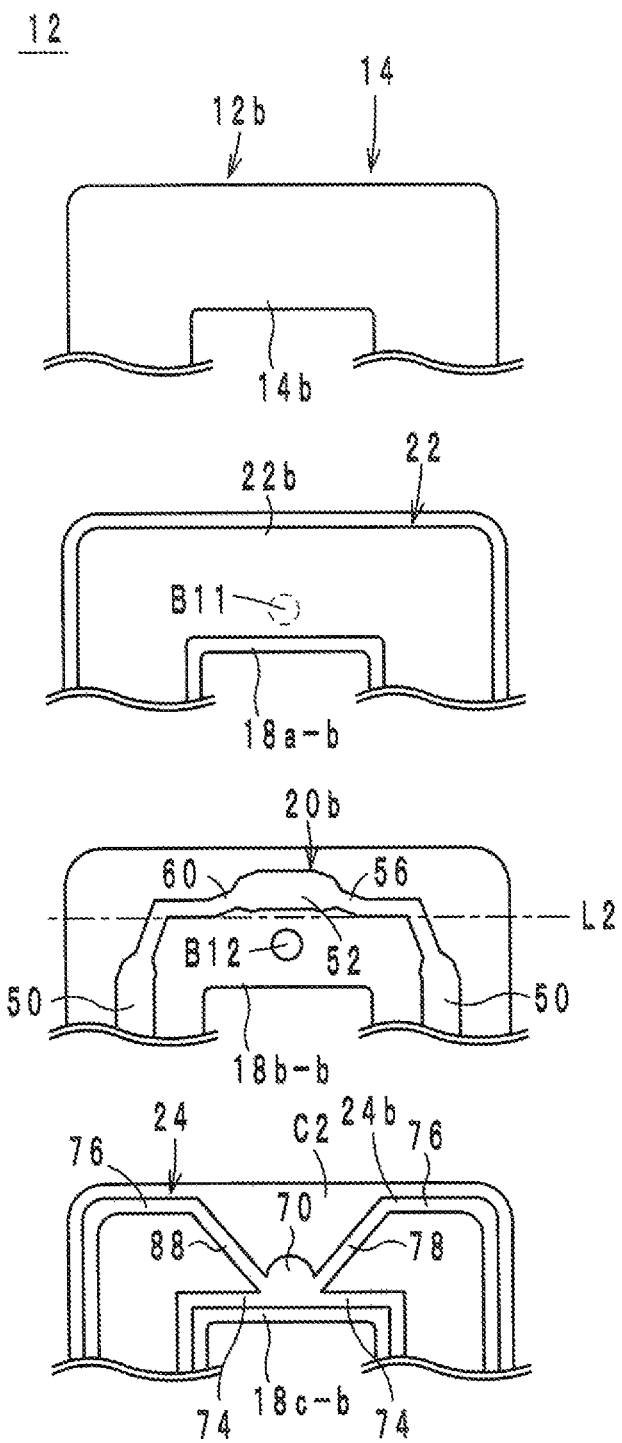
FIG. 17 is an exploded view of the high-frequency signal line according to the first modification of a preferred embodiment of the present invention.

As seen in FIG. 17, the main conductive portion 24b of the auxiliary ground conductor 24 includes the connection portion 70, the sides 74 and 76, and the bridges 78 and 88. The side 74 is a linear conductor configuring a side on the negative side in x-axis direction of the main conductive portion 24b and extends in y-direction. The side 76 is a linear conductor defining a side on the positive side in x-axis direction of the main conductive portion 24b and extends in y-direction. The connection portion 70 is semicircular and protrudes to the positive side in x-axis direction from the side 74. The connection portion 70 is provided in the center of the side 74 in y-direction.

The bridge 78 is a linear conductor extending from the connection portions 70 diagonally to the positive side in x-direction and to the negative side in y-direction. The bridge 78 is connected to the side 76.

The bridge 88 is a linear conductor extending from the connection portions 70 diagonally to the positive side in x-direction and to the positive side in y-direction. The bridge 88 is connected to the side 76.

Further, the cutout C2 is provided in the side 76 of the main conductive portion 24b. In main conductive portion 24b, the cutout C2 is provided on the positive side in x-direction of the connection portion 70. Accordingly, the side 76 is divided by the cutouts C2.

Figure 18:
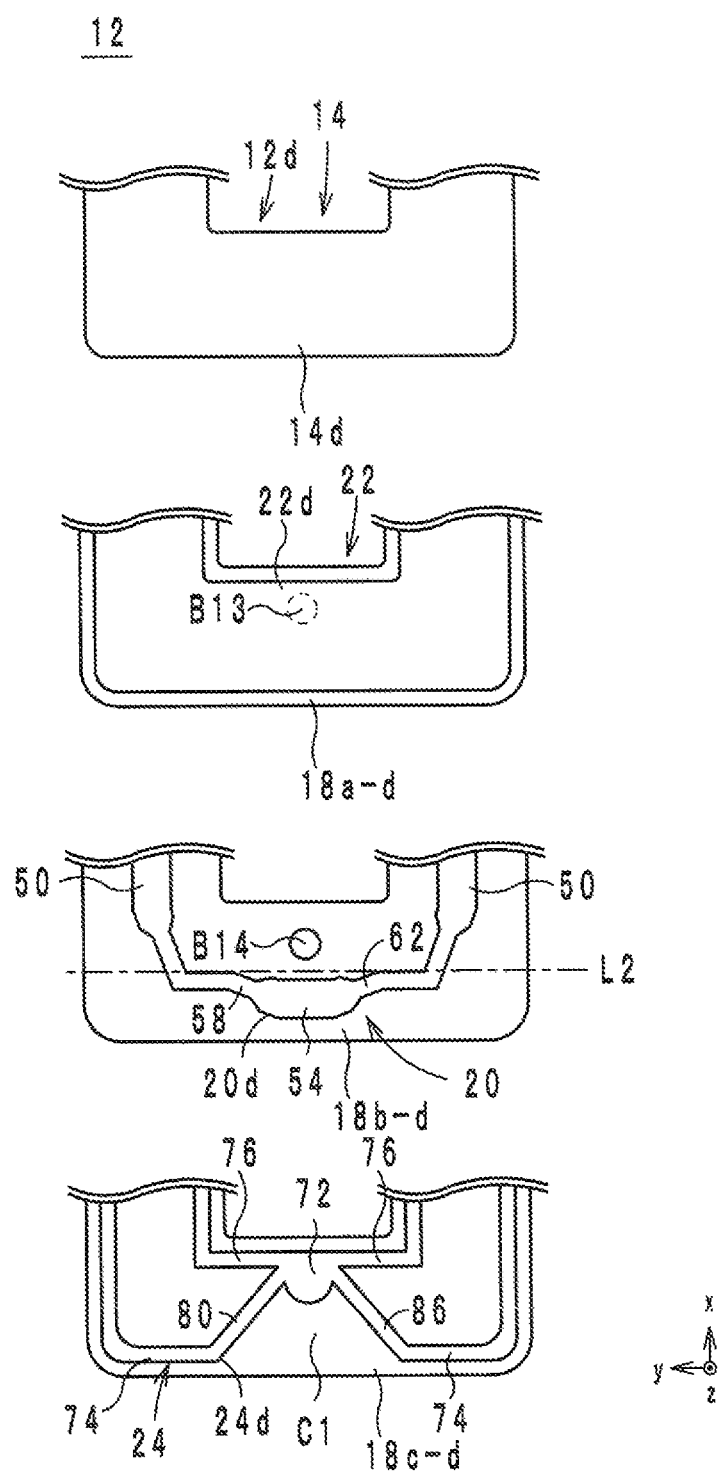
FIG. 18 is an exploded view of the high-frequency signal line according to the first modification of a preferred embodiment of the present invention.

As seen in FIG. 18, the main conductive portion 24d of the auxiliary ground conductor 24 includes the connection portion 72, the sides 74 and 76, and the plurality of bridges 80 and 86. The side 74 is a linear conductor defining a side of the main conductive portion 24d on the negative side in x-direction and extends in y-direction. The side 76 is a linear conductor defining a side of the main conductive portion 24d on the positive side in x-direction and extends in y-direction. The connection portion 72 is semicircular and protrudes from the side 76 to the negative side in x-direction. The connection portion 72 is located in the center of the side 76 in y-direction.

The bridge 80 is a linear conductor extending from the connection portion 72 diagonally to the negative side in x-direction and to the positive side in y-direction. The bridge 80 is connected to the side 74.

The bridge 86 is a linear conductor extending from the connection portion 72 diagonally to the negative side in x-direction and to the negative side in y-direction. The bridge 86 is connected to the side 74.

Further, the cutout C1 is provided in the side 74 of the main conductive portion 24d. In the main conductive portion 24d, the cutout C1 is provided on the negative side in x-direction of the connection portion 72. Accordingly, the side 74 is divided by the cutout C1.

As seen in FIGS. 14 through 18, a plurality of via-hole conductors B11 pierce through the line portions 18a-a, 18a-b, 18a-c and 18a-e in z-direction. In the line portions 18a-a and 18a-e, as seen in FIGS. 14 and 15, the plurality of via-hole conductors B11 are provided on the negative side in y-direction of the center line L2 in y-direction of the line portions 12a and 12e, and are arranged in a line in x-direction. Further, in the line portion 18a-c, as seen in FIG. 16, the plurality of via-hole conductors B11 are provided on the positive side in y-direction of the center line L2 in y-direction of the line portion 12c, and are arranged in a line in x-direction. Further, in the line portion 18a-b, as seen in FIG. 17, the plurality of via-hole conductors B11 are provided on the negative side in x-direction of the center line L2 in x-direction of the line portion 12b. In the line portion 18a-d, as seen in FIG. 18, none of the via-hole conductors B3 is provided.

As seen in FIGS. 14 through 18, a plurality of via-hole conductors B12 pierce through the line portions 18b-a, 18b-b, 18b-c and 18b-e in z-direction. In the line portions 18b-a and 18b-e, as seen in FIGS. 14 and 15, the plurality of via-hole conductors B12 are provided on the negative side in y-direction of the center line L2 in y-direction of the line portions 12a and 12e, and are arranged in a line in x-direction. Further, in the line portion 18b-c, as seen in FIG. 16, the plurality of via-hole conductors B12 are provided on the positive side in y-direction of the center line L2 in y-direction of the line portion 12c, and are arranged in a line in x-direction. Further, in the line portion 18b-b, as seen in FIG. 17, the plurality of via-hole conductors B12 are provided on the negative side in x-direction of the center line L2 in x-direction of the line portion 12b. In the line portion 18b-d, as seen in FIG. 18, none of the via-hole conductors B12 is provided.

Each of the via-hole conductors B11 and each of the via-hole conductors B12 are connected to each other to define one via-hole conductor to connect the main ground conductor 22 to the auxiliary ground conductor 24. The via-hole conductors B11 and B12 are formed by filling through holes made in the dielectric sheets 18a and 18b with a metallic material.

As seen in FIGS. 14 through 18, a plurality of via-hole conductors B13 pierce through the line portions 18a-a, 18a-c, 18a-d and 18a-e in z-direction. In the line portions 18a-a and 18a-e, as seen in FIGS. 14 and 15, the plurality of via-hole conductors B13 are provided on the positive side in y-direction of the center line L2 in y-direction of the line portions 12a and 12e, and are arranged in a line in x-direction. Further, in the line portion 18a-c, as seen in FIG. 16, the plurality of via-hole conductors B13 are provided on the negative side in y-direction of the center line L2 in y-direction of the line portion 12c, and are arranged in a line in x-direction. Further, in the line portion 18a-d, as seen in FIG. 18, the plurality of via-hole conductors B13 are provided on the positive side in x-direction of the center line L2 in x-direction of the line portion 12d. In the line portion 18a-b, as seen in FIG. 17, none of the via-hole conductors B13 is provided.

As seen in FIGS. 14 through 18, a plurality of via-hole conductors B14 pierce through the line portions 18b-a, 18b-c, 18b-d and 18b-e in z-direction. In the line portions 18b-a and 18b-e, as seen in FIGS. 14 and 15, the plurality of via-hole conductors B14 are provided on the positive side in y-direction of the center line L2 in y-direction of the line portions 12a and 12e, and are arranged in a line in x-direction. Further, in the line portion 18b-c, as seen in FIG. 16, the plurality of via-hole conductors B14 are provided on the negative side in y-direction of the center line L2 in y-direction of the line portion 12c, and are arranged in a line in x-direction. Further, in the line portion 18b-d, as seen in FIG. 18, the plurality of via-hole conductors B14 are provided on the positive side in x-direction of the center line L2 in x-direction of the line portion 12d. In the line portion 18b-b, as seen in FIG. 17, none of the via-hole conductors B14 is provided.

Each of the via-hole conductors B13 and each of the via-hole conductors B14 are connected to each other to define one via-hole conductor to connect the main ground conductor 22 to the auxiliary ground conductor 24. The via-hole conductors B13 and B14 are formed preferably by filling through holes made in the dielectric sheets 18a and 18b with a metallic material.

In the line portions 12a, 12c and 12e of the high-frequency signal line 10a, the section in which the via-hole conductors B11 and B12 are provided will hereafter be referred to as a section A2. In the line portions 12a, 12c and 12e of the high-frequency signal line 10a, the section A2 means a region overlapping the via-hole conductors B11 and B12 in y-direction. Further, in the line portions 12a, 12c and 12e of the high-frequency signal line 10b, the section in which the via-hole conductors B13 and B14 are provided will hereafter be referred to as a section A3. The section A3 means the region overlapping the via-hole conductors B13 and B14 in y-direction.

Here, in the line portions 12a, 12c and 12e, the position of each of the via-hole conductors B11 and B12, and the position of each of the via-hole conductors B13 and B14 are different from each other in x-direction. In this present preferred embodiment, the via-hole conductors B11 and B12 are arranged alternately in x-direction, and the via-hole conductors B13 and B14 are arranged alternately in x-direction. Further, each of the via-hole conductors B11 and B12 is located on the middle point between each of an adjacent pair of the via-hole conductors B13 and an adjacent pair of the via-hole conductors B14 with respect to x-direction. Also, each of the via-hole conductors B13 and B14 is located on the middle point between each of an adjacent pair of the via-hole conductors B11 and an adjacent pair of the via-hole conductors B12 with respect to x-direction.

Further, in the line portions 12a, 12c, and 12e of the high-frequency signal line 10a, the section sandwiched between the section A2 and the section A3 is referred to as a section A1. The section A1 is a section in which the via-hole conductors B11 through B14 are not provided.

Here, the signal line 20 meanders as seen in FIGS. 14 through 18. First, the conductive traces 20a and 20e in the line portions 12a and 12e will be described.

The conductive traces 20a and 20e in a section A1 are located on the negative side in y-direction of the conductive traces 20a and 20e in a section A2. Further, the conductive traces 20a and 20e in the section A1 are located on the positive side in y-direction of the conductive traces 20a and 20e in a section A3. Thus, the signal line 20 bypasses via-hole conductors B11 and B12, and via-hole conductor B13 and B14.

Also, the conductive traces 20a and 20e include thick line portions 50, 52 and 54 and thin line portions 56, 58, 60 and 62. The line width of the thick line portions 50, 52 and 54 is the line width W1. The line width of the thin line portions 56, 58, 60 and 62 is the line width W2. The line width W1 is larger than the line width W2. In the section A1, the thick line portion 50 extends in x-axis direction on the center line L2 in y-direction of the line portions 18b-a and 18b-e. The thick line portion 50 overlaps the openings 30 and 32 when viewed from z-direction. Therefore, the thick line portion 50 does not overlap the auxiliary ground conductor 24 when viewed from z-direction.

In the section A2, the thick line portion 52 extends in x-axis direction on the positive side in y-direction of the center line L2 in y-direction of the line portions 18*b*-*a* and 18*b*-*e*. However, the both ends of the thick line portion 52 in x-axis direction extend into the section A1. The thick line portion 52 overlaps the cutouts C2 when viewed from z-direction. Accordingly, the thick line portion 52 does not overlap the auxiliary ground conductor 24 when viewed from z-direction.

In the section A3, the thick line portion 54 extends in x-axis direction on the negative side in y-direction of the center line L2 in y-direction of the line portion 18*b*-*a* and 18*b*-*e*. However, the both ends of the thick line portion 54 in x-axis direction extend into the section A1. The thick line portion 54 overlaps the cutouts C1 when viewed from z-direction. Accordingly, the thick line portion 54 does not overlap the auxiliary ground conductor 24 when viewed from z-direction. The both ends of each of such thick line portions 50, 52 and 54 are tapered.

In the section A1, the thin line portion 56 connects the positive x-direction end of the thick line portion 52 and the negative x-direction end of the thick line portion 50. The thin line portion 56 extends diagonally to the negative side in y-direction and to the positive side in x-direction. As seen in FIGS. 14 and 15, the thin line portion 56 overlaps the bridge 78 when viewed from y-direction.

In the section A1, the thin line portion 58 connects the positive x-direction end of the thick line portion 50 and the negative x-direction end of the thick line portion 54. The thin line portion 58 extends diagonally to the negative side in y-direction and to the positive side in x-direction. As seen in FIGS. 14 and 15, the thin line portion 58 overlaps the bridge 80 when viewed from y-direction.

In the section A1, the thin line portion 60 connects the positive x-direction end of the thick line portion 50 and the negative x-direction end of the thick line portion 52. The thin line portion 60 extends diagonally to the positive side in y-direction and to the positive side in x-direction. As seen in FIGS. 14 and 15, the thin line portion 60 overlaps the bridge 88 when viewed from y-direction.

In the section A1, the thin line portion 62 connects the positive x-direction end of the thick line portion 54 and the negative x-direction end of the thick line portion 50. The thin line portion 62 extends diagonally to the positive side in y-direction and to the positive side in x-direction. As seen in FIGS. 14 and 15, the thin line portion 62 overlaps the bridge 86 when viewed from y-direction.

The conductive trace 20*c* of the line portion 12*c* will hereinafter be described. The conductive trace 20*c* has a structure formed by rotating the conductive traces 20*a* and 20*e* by 180 degrees about z-axis. Therefore, detailed descriptions of the conductive trace 20*c* are omitted.

The conductive trace 20*b* in the line portion 12*c* will hereinafter be described. As seen in FIG. 17, the conductive trace 20*b* bypasses the via-hole conductors B11 and B12. More specifically, the conductive trace 20*b* has the thick line portion 52 and the thin line portions 56 and 60. The line width of the thick line portion 52 is line width W1. The line width of the thin line portions 56 and 60 is line width W2. The line width W1 is larger than line width W2.

The thick line portion 52 extends at the center in y-direction of the line portion 12*b* and in y-direction on the positive side in x-direction of the center line L2 in x-direction of the line portion 18*b*-*b*. The thick line portion 52 overlaps the cutouts C2 when viewed from z-direction. Therefore, the thick line portion 52 does not overlap the auxiliary ground conductor 24 when viewed from z-direction. The both ends of such thick line portions 52 are tapered.

The thin line portion 56 connects the negative y-direction end of the thick line portion 52 and the positive x-direction end of the thick line portion 50. As seen in FIG. 17, the thin line portion 56 overlaps the bridge 78 when viewed from y-direction.

The thin line portion 60 connects the positive y-direction end of the thick line portion 52 and the positive x-direction end of the thick line portion 50. As seen in FIG. 17, the thin line portion 60 overlaps the bridge 88 when viewed from y-direction.

The conductive trace 20*d* of the line portion 12*d* will hereinafter be described. As seen in FIG. 18, the conductive trace 20*d* bypasses the via-hole conductors B13 and B14. More specifically, the conductive trace 20*d* includes the thick line portion 54 and the thin line portions 58 and 62. The line width of the thick line portion 54 is line width W1. The line width of the thin line portions 58 and 62 is line width W2. The line width W1 is larger than line width W2.

The thick line portion 54 extends at the center in y-direction of the line portion 12*d* and in y-direction on the negative side in x-direction of the center line L2 in x-direction of the line portion 18*b*-*d*. The thick line portion 54 overlaps the cutouts C1 when viewed from z-direction. Therefore, the thick line portion 54 does not overlap the auxiliary ground conductor 24 when viewed from z-direction. The both ends of such thick line portion 54 are tapered.

The thin line portion 58 connects the positive y-direction end of the thick line portion 54 and the positive x-direction end of the thick line portion 50. As seen in FIG. 18, the thin line portion 58 overlaps the bridge 80 when viewed from y-direction.

The thin line portion 62 connects the negative y-direction end of the thick line portion 54 and the positive x-direction end of the thick line portion 50. As seen in FIG. 18, the thin line portion 62 overlaps the bridge 86 when viewed from y-direction.

In the high-frequency signal line 10*a* having the structure above, for example, when the line portion 12*b* is viewed from z-direction, via-hole conductors are not provided in an area farther in the positive x-direction than the signal line 20, but are provided in an area farther in the negative x-direction than the signal line 20. Thus, similarly to the high-frequency signal line 10, the high-frequency signal line 10*a* satisfies both maintenance of the flexibility of the dielectric base 12 and reduction of changes in the characteristic impedance of the high-frequency signal line 10*a*. Also, with the high-frequency signal line 10*a*, it is not necessary that, as in the high-frequency signal line 10, two via-hole conductors are provided on both sides of the signal line 20 when the line portions 12*a*, 12*c* and 12*e* are viewed from z-direction. Accordingly, the number of via-hole conductors adjacent to the signal line 20 is reduced, and floating capacitance generated in the signal line 20 is significantly reduced. Thus, the line width of the signal line 20 is able to be increased, and the transmission loss is significantly reduced. Further, in the high-frequency signal line 10*a*, two via-hole conductors are not provided on both sides of the signal line 20 when the line portions 12*a*, 12*c* and 12*e* are viewed from z-direction, and thus the width of the high-frequency signal line 10*a* is able to be supplemented.

Figure 19:
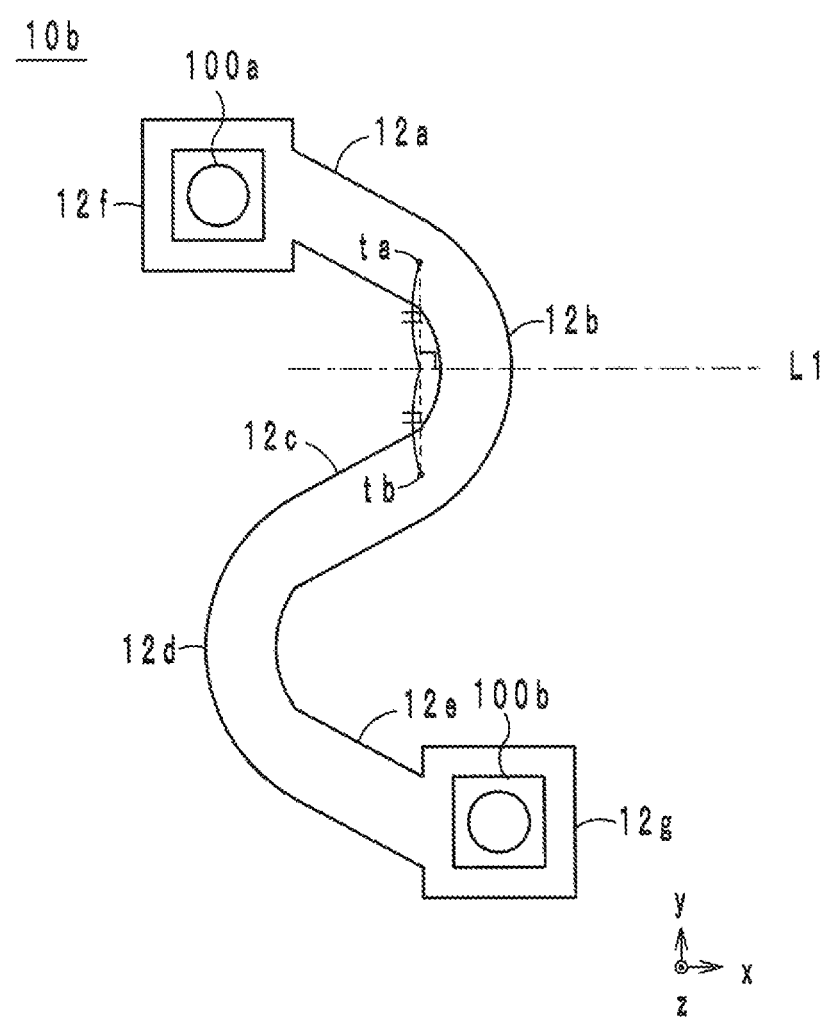
FIG. 19 is a plan view from z-direction of a high-frequency signal line according to a second modification of a preferred embodiment of the present invention.
Figure 20:
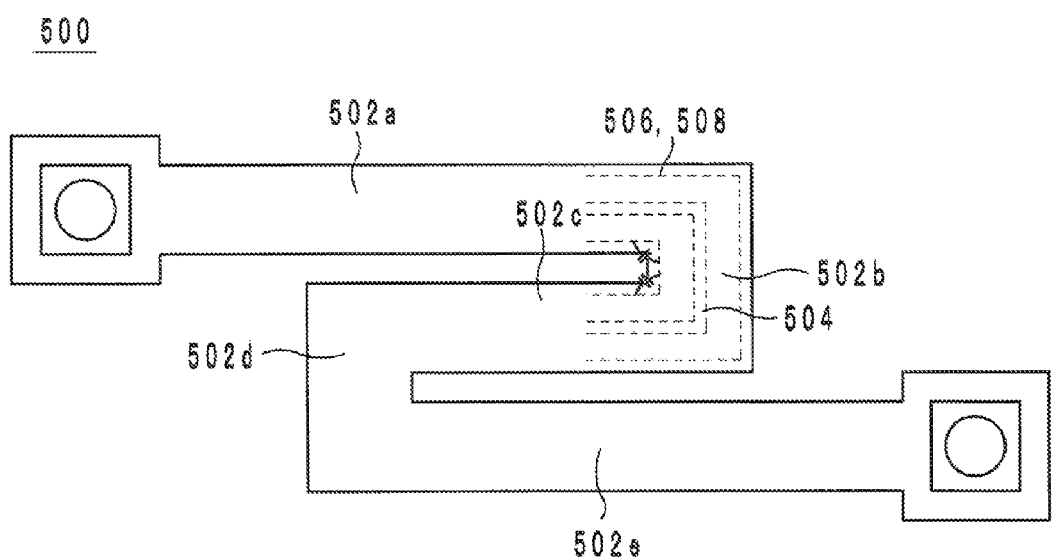
FIG. 20 illustrates a high-frequency signal line of which center portion with respect to the widthwise direction has a meandering shape.
Figure 21:
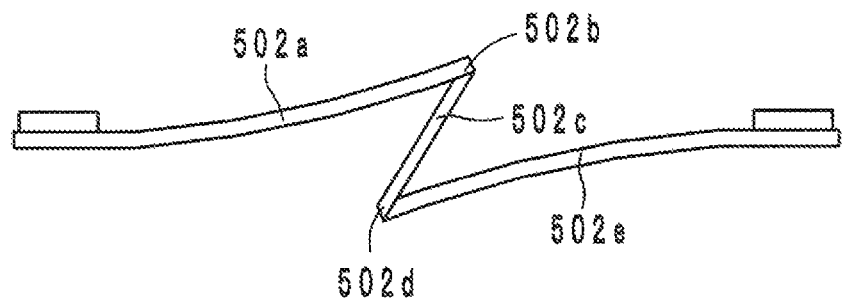
FIG. 21 illustrates a state of the high-frequency signal line when both ends thereof are pulled.

The structure of a high-frequency signal line according to a second modification of a preferred embodiment of the present invention will hereinafter be described with reference to the drawings. FIG. 19 is a plan view from z-direction of a high-frequency signal line 10b according to the second modification.

A high-frequency signal line 10b is different from the high-frequency signal line 10 in the shapes of the line portions 12a through 12e. More specifically, in the high-frequency signal line 10, the line portions 12a, 12c and 12e are parallel or substantially parallel to the straight line L1. On the other hand, in the high-frequency signal line 10b, the line portions 12a, 12c and 12e are not parallel or substantially parallel to the straight line L1. However, in the high-frequency signal line 10b, the line portions 12a, 12c and 12e extend along the straight line L1. The line portion 12a extends to the positive side in x-direction and to the negative side in y-direction. The line portion 12c extends to the negative side in x-direction and to the negative side in y-direction. The line portion 12e extends to the positive side in x-direction and to the negative side in y-direction. Here, the straight line L1 is a perpendicular bisector of a line segment connecting the positive x-direction end to of the line portion 12a and the positive x-direction end tb of the line portion 12c.

Also, the line portion 12b connects the positive x-direction end of the line portion 12a and the positive x-direction end of the line portion 12c, and preferably has a curved arc-shape to protrude to the positive side in x-direction. The line portion 12d connects the negative x-direction end of the line portion 12c and the negative x-direction end of the line portion 12e, and preferably has a curved arc-shaped to protrude to the negative side in x-direction. It should be noted that the internal structure of the high-frequency signal line 10b is the same as the internal structure of the high-frequency signal line 10, and descriptions of this structure is omitted.

In the high-frequency signal line 10b having the structure above, both maintenance of the flexibility of the dielectric base 12 and reduction of changes in the characteristic impedance of the high-frequency signal line 10b are satisfied similarly to the high-frequency signal line 10.

Also, that the line portions 12a, 12c and 12e extend along the straight line L1 means that the line portions 12a, 12c and 12e may be inclined with respect to the straight line L1. The permissible range of the angle defined between the straight line L1 and each of the line portions 12a, 12c and 12e is determined by the effect exhibited by the high-frequency signal line 10b, and is a range in which the high-frequency signal line 10b satisfies both maintenance of the flexibility of the dielectric base 12 and reduction of changes in the characteristic impedance of the high-frequency signal line 10b.

OTHER PREFERRED EMBODIMENTS

The high-frequency signal line according to the present invention is not limited to the high-frequency signal lines 10, 10a and 10b, and can be modified within the scope of the present invention.

It should be noted that the structures of the high-frequency signal lines 10, 10a and 10b may be arbitrarily combined.

The protective layer 14 preferably is formed by screen printing, but may be formed by a photolithography process.

It should be noted that, in the high-frequency signal lines 10, 10a and 10b, the connectors 100a and 100b need not be mounted. In this case, the ends of the high-frequency signal lines 10, 10a and 10b are connected to the circuit board by solder or the like. It should be noted that the connector 100a may be mounted on only one end of each of the high-frequency signal lines 10, 10a and 10b.

It should be noted that a through hole conductor may be used instead of the via-hole conductor. The through hole conductor is an interlayer connection conductor which is formed preferably by providing a conductor on the inner peripheral surface of the through hole of the dielectric base 12 by means of, such as plating or the like.

It should be noted that the openings 30 may not be formed in the auxiliary ground conductor 24.

It should be noted that the via-hole conductors B1 through B4 need not be provided in all the line portions 12a, 12b and 12e and may be provided only in at least one of the line portions 12a, 12b and 12e. However, it is preferred that the via-hole conductors B1 through B4 are provided in all the line portions 12a, 12b and 12e in order to stabilize the ground potential.

Also, the line portions 12b and 12d of the high-frequency signal lines 10 and 10a may be curved as in the line portions 12b and 12d of the high-frequency signal line 10b.

It should be noted that the straight line L1 may not be the perpendicular bisector of the line segment connecting the positive x-direction end to of the line portion 12a and the positive x-direction end tb of the line portion 12c.

It should be noted that each of the high-frequency signal lines 10 and 10a may not have the meandering shape. For example, the line portions 12d and 12e may not be provided in the high-frequency signal lines 10 and 10a.

Also, in the high-frequency signal line 10b, the length of the line portions 12a, 12c, and 12e may be longer than those shown.

It should be noted that the high-frequency signal lines 10, 10a and 10b may be used as a high-frequency signal line in an RF circuit board, such as an antenna front end module.

As described above, preferred embodiments of the present invention are useful in a high-frequency signal line and an electronic device provided with the high-frequency signal line, and are excellent in that the high-frequency signal line satisfies both maintenance of the flexibility of the dielectric base and reduction of changes in the characteristic impedance of the high-frequency signal line.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency signal line comprising:
a flexible dielectric base including a plurality of dielectric sheets stacked in a stacking direction;
a first line portion extending along a predetermined straight line parallel or substantially parallel to a predetermined direction, a second line portion extending along the predetermined straight line, and a third line portion connecting one side end of the first line portion in the predetermined direction and one side end of the second line portion in the predetermined direction;
a signal line which extends along the first line portion, the second line portion, and the third line portion;
a first ground conductor which is located on the one side in the layer stacking direction of the signal line in or on the dielectric base and extends along the signal line;

a second ground conductor which is located on the other side in the stacking direction of the signal line in or on the dielectric base and extends along the signal line; and one or more interlayer connection conductors which pierce through the dielectric sheets and connect the first ground conductor and the second ground conductor; wherein in the third line portion, the interlayer connection conductor is not provided on the one side in the predetermined direction of the signal line when viewed from the stacking direction but is provided on the other side in the predetermined direction of the signal line.

2. The high-frequency signal line according to claim 1, wherein the predetermined straight line is a perpendicular bisector of a line segment connecting the one side end of the first line portion in the predetermined direction and the one side end of the second line portion in the predetermined direction.

3. The high-frequency signal line according to claim 2, wherein the interlayer connection conductor located in the first line portion and closest to the one side end in the predetermined direction is a first interlayer connection conductor;

the interlayer connection conductor located in the third line portion and closest to the first line portion is a third interlayer connection conductor; and a length of the signal line between a first portion located in the signal line and closest to the first interlayer connection conductor and a third portion located in the signal line and closest to the third interlayer connection conductor is about ¼ or less of a wavelength of electromagnetic waves transmitted through the signal line.

4. The high-frequency signal line according to claim 1, wherein the dielectric base further includes a fourth line portion being provided on the side opposite to the first line portion from the second line portion, and extending along the predetermined straight line, and a fifth line portion connecting the other side end of the second line portion in the predetermined direction and the other side end of the fourth line portion in the predetermined direction; and in the fifth line portion, the interlayer connection conductor is not provided on the other side in the predetermined direction of the signal line when viewed from the layer stacking direction, but is provided on the one side in the predetermined direction of the signal line.

5. The high-frequency signal line according to claim 4, wherein in the second line portion, the interlayer connection conductor closest to the other predetermined direction end is a second interlayer connection conductor, and the interlayer connection conductor provided closest to the second line portion of the fifth line portion is a fifth interlayer connection conductor;

a length of the signal line between a second portion closest to the second interlayer connection conductor of the signal line and a fifth portion closest to the fifth interlayer connection conductor of the signal line is about ¼ or less of a wavelength of electromagnetic waves transmitted through the signal line.

6. The high-frequency signal line according to claim 4, wherein the dielectric base has a structure in which, when the first line portion is pulled to the other side in the predetermined direction and the fourth line portion is pulled to the one side in the predetermined direction, the third line portion and the fifth line portion are twisted and deformed.

7. An electronic device comprising:
a case; and
a high-frequency signal line stored in the case, the high-frequency signal line including:
a flexible dielectric base including a plurality of dielectric sheets stacked in a stacking direction;
a first line portion extending along a predetermined straight line parallel or substantially parallel to a predetermined direction, a second line portion extending along the predetermined straight line, and a third line portion connecting one side end of the first line portion in the predetermined direction and one end of the second line portion in the predetermined direction;
a signal line which extends along the first line portion, the second line portion, and the third line portion;
a first ground conductor which is located on the one side in the stacking direction of the signal line in the dielectric base and extends along the signal line;
a second ground conductor which is located on the other side in the stacking direction of the signal line in the dielectric base and extends along the signal line; and
one or more interlayer connection conductors which pierce through the dielectric sheets and connect the first ground conductor and the second ground conductor; wherein
in the third line portion, the interlayer connection conductor is not provided on the one side in the predetermined direction of the signal line when viewed from the layer stacking direction but is provided on the other side in the predetermined direction of the signal line.

8. The electronic device according to claim 7, wherein the predetermined straight line is a perpendicular bisector of a line segment connecting the one side end of the first line portion in the predetermined direction and the one side end of the second line portion in the predetermined direction.

9. The electronic device according to claim 8, wherein
the interlayer connection conductor located in the first line portion and closest to the one side end in the predetermined direction is a first interlayer connection conductor;
the interlayer connection conductor located in the third line portion and closest to the first line portion is a third interlayer connection conductor; and
a length of the signal line between a first portion located in the signal line and closest to the first interlayer connection conductor and a third portion located in the signal line and closest to the third interlayer connection conductor is about ¼ or less of a wavelength of electromagnetic waves transmitted through the signal line.

10. The electronic device according to claim 7, wherein
the dielectric base further includes a fourth line portion being provided on the side opposite to the first line portion from the second line portion, and extending along the predetermined straight line, and a fifth line portion connecting the other side end of the second line portion in the predetermined direction and the other side end of the fourth line portion in the predetermined direction; and
in the fifth line portion, the interlayer connection conductor is not provided on the other side in the predetermined direction of the signal line when viewed from the layer stacking direction, but is provided on the one side in the predetermined direction of the signal line.

11. The electronic device according to claim 10, wherein
in the second line portion, the interlayer connection conductor closest to the other predetermined direction end is a second interlayer connection conductor, and the interlayer connection conductor provided closest to the second line portion of the fifth line portion is a fifth interlayer connection conductor;

a length of the signal line between a second portion closest to the second interlayer connection conductor of the signal line and a fifth portion closest to the fifth interlayer connection conductor of the signal line is about ¼ or less of a wavelength of electromagnetic waves transmitted through the signal line.

12. The electronic device according to claim 10, wherein the dielectric base has a structure in which, when the first line portion is pulled to the other side in the predetermined direction and the fourth line portion is pulled to the one side in the predetermined direction, the third line portion and the fifth line portion are twisted and deformed.

* * * * *